United States Patent [19]
Kohno

[11] Patent Number: 6,041,013
[45] Date of Patent: Mar. 21, 2000

[54] SEMICONDUCTOR MEMORY DEVICE, METHOD OF LAYING OUT SEMICONDUCTOR MEMORY DEVICE, METHOD OF DRIVING SEMICONDUCTOR PATTERN OF SEMICONDUCTOR DEVICE

[75] Inventor: Fumihiro Kohno, Yokohama, Japan

[73] Assignee: Kabushiki Kaisha Toshiba, Kawasaki, Japan

[21] Appl. No.: 09/289,964

[22] Filed: Apr. 13, 1999

Related U.S. Application Data

[62] Division of application No. 08/904,955, Aug. 1, 1997, Pat. No. 5,943,285.

[30] Foreign Application Priority Data

Aug. 5, 1996 [JP] Japan .................................. 8-206206

[51] Int. Cl.[7] .................................................. G11C 8/00
[52] U.S. Cl. ..................... 365/230.03; 365/203; 365/233; 365/230.08
[58] Field of Search ............................. 365/230.03, 233, 365/203, 230.08

[56] References Cited

U.S. PATENT DOCUMENTS

| | | |
|---|---|---|
| 5,402,376 | 3/1995 | Horiguchi et al. ....................... 365/200 |
| 5,420,824 | 5/1995 | Kajimoto et al. ......................... 365/51 |
| 5,502,675 | 3/1996 | Kohno et al. ............................ 365/200 |
| 5,555,215 | 9/1996 | Nakagome et al. ..................... 365/226 |
| 5,604,710 | 2/1997 | Tomishima et al. ...................... 365/51 |
| 5,677,880 | 10/1997 | Horiguchi et al. ...................... 365/200 |

OTHER PUBLICATIONS

Y. Nitta, et al. "A 1.G/s Data–rate 1Gb Synchronous DRAM with Hierarchical Square–Shaped Memory Block and distributed Bank Architecture", *IEEE International Solid–State Circuits Conference*, Feb. 10, 1996, pp. 376–377.

*Primary Examiner*—David Nelms
*Assistant Examiner*—Hien Nguyen
*Attorney, Agent, or Firm*—Oblon, Spivak, McClelland, Maier & Neustadt, P.C.

[57] ABSTRACT

A semiconductor memory device adapted to enhanced functional features and a large memory capacity. The semiconductor memory device includes a semiconductor chip divided into 9 regions B1 through B9 having an identical area, in a 3×3 pattern. A main control block is arranged at least in a central region B9 and memory blocks are arranged respectively in the peripheral regions B1 through B8 of the 9 regions. Each of the memory blocks is controlled by the main control block and includes a data input/output circuit and a memory control circuit.

10 Claims, 29 Drawing Sheets

LAYOUT OF INTERNAL COMMAND SIGNAL LINE/
INTERNAL CLOCK LINE

LAYOUT OF INTERNAL ADDRESS SIGNAL LINES

LAYOUT OF I/O-CONTROL SIGNAL LINES

SEMICONDUCTOR MEMORY DEVICE, METHOD OF LAYING OUT SEMICONDUCTOR MEMORY DEVICE, METHOD OF DRIVING SEMICONDUCTOR PATTERN OF SEMICONDUCTOR DEVICE

This application is a division of application Ser. No. 08/904,955 Filed on Aug. 1, 1997 now U.S. Pat. No. 5,943,285.

BACKGROUND OF THE INVENTION

This invention generally relates to a semiconductor memory device and, more particularly, relates to a structure and method of arranging and wiring memory blocks and external pads that can realize a fast flow of data.

FIGS. 29A and 29B of the accompanying drawings show a background dynamic type RAM. FIG. 29A is an external plan view whereas FIG. 29B is a plan view showing an inside of a package.

As shown in FIG. 29A, a dynamic type RAM (hereinafter referred to as a DRAM) type chip 100 is rectangularly parallelepipedic with short and long edges having a ratio of about 1:2. A group of pads 102 operate as input/output terminals of the chip 100. Two pad group arrangements are currently popular. The pad group 102 may be arranged either along an edge of the chip 100 or longitudinally along a central line of the short edges, the latter being referred to as a center pad arrangement.

As shown in FIG. 29B, with a chip 100 having a center pad arrangement, the pad group 102 of the chip 100 and the lead group of a package 200 are connected to each other by a bonding wire 300 when the chip 100 is housed in a resin-sealed package 200. Then, the DRAM can be provided with external input/output terminals on lateral sides of the package 200 along the longitudinal direction thereof.

Currently, efforts are being made to provide improved or newly developed DRAMs having a large memory capacity and enhanced functional features.

Enhanced functional features may be expressed in terms of bits. Multi-bit products include 4-bit, 8-bit, 16-bit and 32-bit DRAMs. The number of data input/output pads dramatically increases for multi-bit DRAMs of a higher order. This means that, with the center pad arrangement illustrated in FIGS. 29A and 29B, a chip 100 may not be able to accommodate a large number of pads.

Additionally, as a memory capacity is increased for DRAMs, more and more fine and minute circuit elements including memory cells and transistors are used. However, the efforts for producing fine and minute circuit elements can not necessarily catch up to the increased degree of integration of a DRAM, particularly in terms of a number of circuit elements so that a large chip 100 is inevitably used for each product. A large chip 100 means long wires used in a data transfer circuit to connect I/O pads and memory cells for storing data of a DRAM, and long control signal lines extending from a control circuit for controlling the data transfer circuit to the data transfer circuit itself. Long control signal lines and long wires used in the data transfer circuit by turn give rise to a problem of requiring a large space for accommodating the wires and a problem of a slow transmission rate for control signals and data signals.

FIG. 30 is a plan view of a background DRAM showing an arrangement of data lines.

As shown in FIG. 30, data lines include bit lines (BL) formed in memory cell arrays 104, DQ lines (DQ) arranged perpendicularly relative to the respective bit lines in sense amplifier regions 106 and connected to the bit lines by way of respective column gates (not shown), RWD lines (RWD) formed in bus regions 108 along center lines of 16 M core blocks in parallel with the bit lines BL and connected to the DQ lines by way of respective DQ buffers (not shown) and RD/WD lines (RD/WD) formed in peripheral region 110 and connecting the RWD lines and I/O buffers formed in the peripheral region 110.

Currently, the peripheral region 110 is produced by separating four 16 M core blocks from one another and the peripheral region 110 has a cross-like plan view. A control circuit (CNT.), internal power supply generating circuits (VPP, VREF, SSB), an address buffer and an I/O buffer are arranged within the cross-shaped peripheral region 110. More specifically, referring to FIG. 30, the control circuit is arranged at the crossing and the internal power supply generating circuits are arranged in the upper and lower regions of the shorter bar-like section of the peripheral region 110 separating the 16 M core blocks, while the address buffer and the I/O buffer are arranged respectively in the right and left regions of the longer bar-like section of the peripheral region 110 separating the 16 M core blocks.

Note that R/D stands for a row decoder and C/D stands for a column decoder in FIGS. 29A and 30.

With the data line arrangement of FIG. 30, the longest data line connecting a memory cell and the I/O buffer is about as long as the longer edge of the chip 100.

In the field of semiconductor memory devices including DRAMs, multi-bit devices are inevitably accompanied with a large chip size. Multi-bit devices of a higher order involve a large number of pads and a large chip size involves long control signal lines and long data lines. While these problems may be currently negligible, they will become serious in the future with the trend of seeking multi-bit devices of an even higher order. For instance, a large number of pads will pose a problem of the difficulty with which they are appropriately arranged. Long control signals lines and data lines will make it difficult to maintain the throughput of a semiconductor memory device to a desired level.

BRIEF SUMMARY OF THE INVENTION

In view of the above identified problems and other problems, it is therefore an object of the present invention to provide a novel semiconductor memory device adapted to enhanced functional features and a large memory capacity as well as a method of laying out such a semiconductor memory device, a method of driving such a memory device and a circuit arrangement pattern suitable for such a memory device.

According to the present invention, the above object is achieved by providing a novel semiconductor memory device including a main control block having an address signal terminal, a clock signal terminal, a command signal terminal and a power supply terminal as external terminals. An address signal generating section is provided for receiving an external address signal fed to the address signal terminal to generate an internal address signals. A command signal generating section receives an external command signal fed to the command signal terminal to generate an internal command signal. A clock signal generating section receives an external clock signal fed to the clock signal terminal to generate an internal clock signal. An internal power supply generating section receives an external supply potential fed to the power supply terminal to generate an internal supply potential. At least one or more than one memory blocks are provided, each having a data input/output terminal and a power supply terminal for data input/output and including a plurality of memory cells for storing data. A data input/output section sends data to and receives data from the data input/output terminal in response to the internal command signal and in synchronism with the internal clock signal. The data input/output section is driven by the source power for data input/output fed to the power supply terminal for data input/output. A memory control section writes data in a specific one of the plurality of memory cells and reads data from a specific one of the plurality of memory cells in response to the internal address signal and in synchronism with the internal clock signal, the memory control section being driven by the internal power supply potential.

With such a semiconductor memory device, since the main control block has an address signal terminal, a clock signal terminal, a command signal terminal and a power supply terminal as external terminals and each of memory blocks has a data input/output terminal and a power supply terminal for data input/output, pads can be arranged on the entire chip in a distributed manner. Thus, pads may be arranged along the edges of the chip or the total area for arranging pads may be increased if compared with a background chip of the same size with pads arranged along a center line. Therefore, the chip can accommodate a greater number of pads and is hence adapted to enhanced functional features and a large memory capacity.

In a further novel semiconductor memory device of the present invention, the address signal generating section includes a row address buffer and column address buffer for producing internal addresses. The command signal generating section may include a bank switching control circuit for independently writing data in and reading data from each bank, a word line control circuit for controlling word lines, a sense amplifier control circuit for controlling sense amplifiers and a read/write discriminating circuit for discriminating between a read out mode and a write in mode. The clock signal generating section may include an internal clock generating circuit for generating an internal clock. The internal power supply generating section may include a DC power supply generating circuit for generating a plurality of internal power supply potentials and the at least one or each of the more than one memory blocks may include a row decoder and a column decoder for selecting a specific memory cell according to the internal address signal, a sense amplifier for amplifying the data of the memory cell, a bit line control circuit for controlling the sense amplifier and bit line precharge, a data line circuit for transferring data between the sense amplifier and the data input/output section, a data line circuit control circuit for controlling the data line, an output buffer and an input buffer contained in the data input/output section and a data input/output control circuit for controlling the data output buffer and the data input buffer.

With such a further novel semiconductor memory device, since not only the memory cells but also the data input/output section of each of the memory blocks have an output buffer and an input buffer, the data lines connecting the memory cells and the output buffers and the input buffers are distributed among the memory blocks. Since the data lines are closed in each memory block, they can be made short relative to the chip size if compared with the background arrangement of extending each data line from a memory cell to a region provided for peripheral circuits and disposed among cell arrays. Since the data lines are made short relative to the chip size, the distance separating the input/output buffer and a memory cell of each memory block is reduced. Thus, an operation of continuously producing data under a condition where a command signal and an address signal are taken in as typically observed in a burst mode can be carried out at high speed. Therefore, there can be provided a novel semiconductor memory device having a data line arrangement capable of showing a currently available highest level or a dramatically higher level of performance and adapted to enhanced functional features and a large memory capacity.

In a further novel semiconductor memory device of the present invention the internal clock signal, the internal address signal, the internal command signal and the internal power supply potential are fed from the main control block to the at least one memory block or each of the more than one memory blocks by using a wire in an upper layer located above the wire used for the at least one or each of the than one memory blocks.

With such a further novel semiconductor memory device, the layer for forming the wires connecting the main control block and each of the memory blocks is arranged above and separated from the layer for forming the wires to be used in each memory block. Thus, the layout of the memory blocks and that of the main control block can be modified independently relative to each other. This by turn can reduce the time period required for developing a semiconductor memory device for greater memory capacity.

In a further novel semiconductor memory device of the present invention the wire used for the at least one memory block or each of the more than one memory blocks is formed by using a first, second or third metal layer and the wire layer for connecting the main control block and the at least one memory block or each of the more than one memory blocks is formed by using a fourth metal layer.

With such a further novel semiconductor memory device, since only the fourth metal layer is used for the wire layer for connecting the main control block and the at least one memory block or each of the more than one memory blocks, the wiring pattern for connecting the main control block and the at least one memory block or each of the more than one memory blocks can be greatly simplified. This in turn can further reduce the time period required for developing a semiconductor memory device for greater memory capacity.

In a further novel semiconductor memory device of the present invention the at least one memory block or each of the more than one memory blocks is divided into a plurality of banks where data can be written in and read out from independently.

With such a further novel semiconductor memory device, since the at least one memory block or each of the more than one memory blocks is divided into a plurality of banks where data can be written in and read out from independently, the data precharge period can be apparently wiped out so that the device can be operated from an external element to continuously produce data. This in turn can increase the rate of producing data per unit time.

According to the invention, the above object is also achieved by further providing a novel semiconductor memory device including a semiconductor chip divided into 9 or 3 by 3 regions having an equal area. A main control block is arranged at least in the central region of the 9 regions and memory blocks controlled by the main control block are arranged respectively in the 8 peripheral regions of the 9 regions, each of the memory blocks including a memory cell array, a data input/output circuit and a memory control circuit.

With such a further novel semiconductor memory device, since a main control block is arranged at least in the central region and memory blocks are arranged respectively in the 8 peripheral regions, the distance between the main control block and each of the memory blocks can be minimized. Therefore, signals can get to each of the memory blocks from the main control block in a reduced period of time so that the operating speed of the device can be prevented from becoming slower if a large chip is used to adapt itself to a large memory capacity.

A semiconductor memory device of the present invention may further feature a connection terminal leading to an external element sealed in a two-dimensionally arranged package therein.

With such a further novel semiconductor memory device, since a connection terminal leading to the external element is arranged two-dimensionally, the device can adapt itself to an increased number of pads.

According to the invention, the above object is also achieved by further providing a novel semiconductor memory device including a semiconductor chip divided into a plurality of memory blocks and input/output terminals and power supply terminals for data input/output operations arranged respectively in the plurality of memory blocks, the data to be read out from or to be written in one of the plurality of memory blocks moving through the input/output terminal arranged in the same memory block.

With such a further novel semiconductor memory device, since the data to be read out from or to be written in one of the plurality of memory blocks moves through the input/output terminal arranged in the same memory block, the distance for transferring data can be reduced if compared with a background case where data are transferred from a memory block to some other region.

A semiconductor memory device of the present invention may further feature that a semiconductor chip is divided into 9 or 3 by 3 regions having an equal area. A main control block is arranged at least in the central region of the 9 regions and memory blocks controlled by the main control block are arranged respectively in the 8 peripheral regions of the 9 regions, each of the plurality memory blocks including a memory a memory cell array, a data input/output circuit and a memory control circuit.

With such a further novel a semiconductor memory device, since a main control block is arranged at least in the central region and memory blocks are arranged respectively in the 8 peripheral regions, the distance between the main control block and each of the memory blocks can be minimized.

According to the invention, the above object is further achieved by providing a method of laying out a semiconductor memory device including steps of preparing a circuit pattern for a memory block including a memory cell array, a data input/output circuit and a memory control circuit and a circuit pattern for a main control block for controlling the memory block, arranging 9 or 3 by 3 regions, each having a size same as that of the circuit pattern of a memory block or that of the circuit pattern of a main control block, whichever is larger, and arranging eight such circuit patterns for memory blocks respectively in the 8 peripheral regions and a circuit pattern for a main control block at least in the central region.

With such a novel method of laying out a semiconductor memory device, since there are arranged 9 or 3 by 3 regions, each having a same size as that of the circuit pattern of a memory block or that of the circuit pattern of a main control block, whichever is larger, the laying out operation can be conducted with limited restrictions in terms of space. For instance, if a large circuit pattern is used for the memory blocks, a free space can be provided for the circuit pattern of the main control block so that the design of the latter may be modified without being subjected to significant restrictions typically in terms of a size of the transistors and that of booster capacitors. Additionally, the free space provided for the main control block may be used partly for arranging a test mode circuit such as a built-in self test circuit. Still additionally, the free space provided for the main control block may be used for additional circuits that may be added in the future. Incorporating an additional functional feature typically requires a free space in the device and the space of the main control block may be used for such an additional functional feature. Thus, such a novel method of laying out a semiconductor memory device is particularly effective for incorporating an additional function feature into a semiconductor memory device without modifying the arrangement of memory blocks in the semiconductor memory device.

If, to the contrary, a large circuit pattern is used for the main control block, a free space is provided for the circuit pattern of the memory blocks. The free space may be used for modifying a design of the memory blocks particularly in terms of the size of the memory cells, that of the sense amplifiers and/or that of the decoders.

According to the invention, the above object is further achieved by providing a semiconductor memory device including a main control block for receiving an external address signal, an external command signal, an external clock signal and an external power supply potential and sending out an internal address signal, an internal command signal, an internal clock signal and an internal power supply potential. A plurality of memory blocks are controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to an external element an output data from a memory cell selected for data reading in synchronism with the internal clock signal. An external pad group is arranged in the main control block for receiving the external address signal, the external command signal, the external clock signal and the external power supply potential and an external pad group is arranged in each of the plurality of memory blocks for receiving the input data and the output data.

With such a novel semiconductor memory device, an external pad group is arranged in a main control block for receiving an external address signal, an external command signal, an external clock signal and an external power supply potential and an external pad group is arranged in each of a plurality of memory blocks for receiving an input data and an output data. With such an arrangement, the area for arranging pads on the chip can be increased if compared with a background device where a pad group for receiving an external address signal, an external command signal, the external clock signal and an external power supply potential as well as an input data and an output data is collectively arranged between memory cell arrays or in a peripheral circuit block arranged along an edge of the chip. This means that a larger number of pads can be arranged on a chip.

According to the invention, the above object is further achieved by providing a novel semiconductor memory device including a main control block for receiving an external address signal, an external command signal, an external clock signal and an external power supply potential and sending out an internal address signal, an internal command signal, an internal clock signal and an internal power supply potential. A plurality of memory blocks are controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to an external element an output data from a memory cell selected for data reading in synchronism with the internal clock signal. A wire group is formed by using an upper wire layer located above the wire group formed in the inside of each of the plurality of memory blocks and connecting the main control block and each of the plurality of memory blocks to feed signals for controlling the plurality of memory blocks.

With such a novel semiconductor memory device, a wire group is formed by using an upper wire layer located above the wire group formed in the inside of each of the plurality of memory blocks and connecting the main control block and each of the plurality of memory blocks to feed signals for controlling the plurality of memory blocks. Thus, the memory blocks and the main control block can be designed independently relative to each other so that the efficiency of developing a new semiconductor memory device of the type under consideration can improved if compared with a background case where memory blocks and a control circuit are designed in a consolidated manner. Thus, the time required for developing such a device can be reduced. The main control block is principally formed of logic circuits to form a logic IC. On the other hand, each of the memory blocks is principally formed of memory circuits to form a memory IC. Therefore, with such a novel semiconductor memory device for which the memory blocks and the main control block can be designed independently relative to each other, the operation of designing the device can be assigned to engineers who specialize in designing particular respective blocks so that the device may be provided with enhanced functional features and designed within a reduced period of time. For instance, since the main control block is a logic IC, a large capacity semiconductor memory device that can be mounted on a processor can be derivatively designed on the basis of a semiconductor memory device according to the invention.

According to the invention, the above object is further achieved by providing a novel semiconductor memory device including a main control block for receiving an external address signal, an external command signal, an external clock signal and an external power supply potential and sending out an internal address signal, an internal command signal, an internal clock signal and an internal power supply potential. A plurality of memory blocks are controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to an external element an output data from a memory cell selected for data reading in synchronism with the internal clock signal. Supply wires connect the main control block and each of the plurality of memory blocks for feeding each of the plurality of memory blocks with the internal address signal, the internal command signal, the internal clock signal and the internal power supply potential generated by the main control block and data transfer circuits are arranged respectively in the plurality of memory blocks, each connecting the external pad for receiving the input data and the output data and the memory cell.

With such a novel semiconductor memory device, data transfer circuits for electrically connecting external pads for receiving input and output data and respective memory cells are distributed among a plurality of memory blocks. Since the data transfer circuits are closed in the respective memory blocks, the length of the data transfer circuits per unit chip size can be reduced if compared with a background case where they are extended to the space separating memory cell arrays or the peripheral circuit block arranged along an edge of the chip so that the data transfer operation can be carried out at high speed.

According to the invention, the above object is a further achieved by providing a novel semiconductor memory device including a semiconductor chip divided into 9 or 3 by 3 region having an equal area. A main control block is arranged at least in the central region of the 9 regions for receiving an external address signal, an external command signal, an external clock signal and an external power supply potential and sending out an internal address signal, an internal command signal, an internal clock signal and an internal power supply potential. Memory blocks are arranged respectively in the 8 peripheral regions of the 9 regions and are controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to an external element an output data from a memory cell selected for data reading in synchronism with the internal clock signal.

With such a novel semiconductor memory device, a semiconductor chip is divided into 9 or 3 by 3 regions having an equal area and a main control block is arranged at least in the central region of the 9 regions while memory blocks are arranged respectively in the 8 peripheral regions. With this arrangement, the memory blocks are separated from the main control block with a substantially same distance to minimize the differences in the delay time of the controls signals and the internal power supply potential generated by the main control block and fed to the memory blocks. Thus, the main control block can control each of the memory blocks very quickly.

According to the invention, the above object is further achieved by providing a novel semiconductor memory device including a semiconductor chip divided into 9 or 3 by 3 regions having an equal area, a main control block arranged at least in the central region of the 9 regions for receiving an external address signal, an external command signal, an external clock signal and an external power supply potential and sending out an internal address signal, an internal command signal, an internal clock signal and an internal power supply potential. Memory blocks are arranged respectively in the 8 peripheral regions of the 9 regions and are controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to an external element an output data from a memory cell selected for data reading in synchronism with the internal clock signal. An external pad group is arranged in the main control block for receiving the external address signal, the external command signal, the external clock signal and the external power supply potential. An external pad group is arranged in each of the plurality of memory blocks for receiving the input data and the output data. Supply wires connect the main control block and each of the plurality of memory blocks for feeding each of the plurality of memory blocks with the internal address signal, the internal command signal, the internal clock signal and the internal power supply potential generated by the main control block and data transfer circuits arranged respectively in the plurality of memory blocks, each connecting the external pad for receiving the input data and the output data and the memory cell.

With such a novel semiconductor memory device, a semiconductor chip is divided into 9 or 3 by 3 regions having an equal area and a main control block is arranged at least in the central region of the 9 regions while memory blocks are arranged respectively in the 8 peripheral regions. With this arrangement, the memory blocks are separated from the main control block with a substantially same distance to minimize the differences in the delay time of the controls signals and the internal power supply potential generated by the main control block and fed to the memory blocks. Thus, the main control block can control each of the memory blocks very quickly.

Additionally, an external pad group is arranged in a main control block for receiving an external address signal, an external command signal, an external clock signal and an external power supply potential and an external pad group is arranged in each of a plurality of memory blocks for receiving an input data and an output data. With such an arrangement, the area for arranging pads on the chip can be increased if compared with a background device where a pad group for receiving an external address signal, an external command signal, an external clock signal and an external power supply potential as well as an input data and an output data is collectively arranged between memory cell arrays or in a peripheral circuit block arranged along an edge of the chip. This means that a larger space can be provided for chip pads.

Still additionally, data transfer circuits for electrically connecting external pads for receiving input and output data and respective memory cells are distributed among a plurality of memory blocks. Since the data transfer circuits are closed in the respective memory blocks, the length of the data transfer circuits per unit chip size can be reduced if compared with a background case where they are extended to the space separating memory cell arrays or the peripheral circuit block arranged along an edge of the chip so that the data transfer operation can be carried out at high speed.

Finally, the data transfer circuits are formed by using only a wire layer located under the wire layer connecting the main control block and each of the plurality of memory blocks and forming feed wires for feeding signals for controlling the plurality of memory blocks. Thus, the main control block and the memory blocks can be designed independently relative to each other to improve the efficiency of developing a new semiconductor memory device of the type under consideration if compared with a background case where memory blocks and a main control block are designed in a consolidated manner.

According to the invention, the above object is further achieved by providing a novel semiconductor memory device including a semiconductor chip divided into 9 or 3 by 3 regions having an equal area. A logic integrated circuit arranged in the central region of the 9 regions and memory integrated circuits are arranged respectively in the 8 peripheral regions of the 9 regions except the central region.

With such a novel semiconductor memory device, a semiconductor chip is divided into 9 or 3 by 3 regions having an equal area and a logic integrated circuit is arranged at least in the central region of the 9 regions while memory integrated circuits, each including a memory cell array, are arranged respectively in the 8 peripheral regions except the central region. With this arrangement, the memory integrated circuits are separated from the logic integrated circuit with a substantially same distance to minimize the differences in the distance. Thus, a single logic integrated circuit can simultaneously control the 8 memory integrated circuits to minimize the delay time of the controls signals getting to the 8 memory integrated circuits. Therefore, it provides an arrangement of 8 memory integrated circuits in a semiconductor memory device that can make the device operate at the highest possible speed.

According to the invention, the above object is further achieved by providing a novel semiconductor memory device including a semiconductor chip divided into 9 or 3 by 3 regions having an equal area. Memory integrated circuits are arranged respectively in the 8 peripheral region of the 9 regions except the central region, each of the memory integrating circuits including a memory cell array, a data input/output circuit for sending out the output data from the memory cell array to an external element of the semiconductor chip and entering the input data from an external element of the semiconductor chip into the memory cell array and a control circuit for controlling the operation of the data input/output circuit and a circuit arranged in the central region of the 9 regions for simultaneously addressing the memory cell arrays included in the 8 memory integrated circuits and a circuit also arranged in the central region for simultaneously specifying an operation mode to at least the control circuits included respectively in the 8 memory integrated circuits.

With such a novel semiconductor memory device, a semiconductor chip is divided into 9 or 3 by 3 regions having an equal area and a logic integrated circuit is arranged at least in the central region of the 9 regions while memory integrated circuits, each including a memory cell array, are arranged respectively in the 8 peripheral regions except the central region. With this arrangement, the memory integrated circuits are separated from the logic integrated circuit with a substantially same distance to minimize the differences in the distance. Thus, a single logic integrated circuit can simultaneously control the 8 memory integrated circuits.

Additionally, each of the 8 memory integrated circuits has a data input/output circuit to minimize the distance between the memory cell array of each memory integrated circuit and the related data input/output circuit. Therefore, the speed of the operation of controlling the semiconductor memory cell having 8 memory integrated circuits can be maximized. Finally, since the distance between the memory cell array of each memory input/output and the related data input/output is minimized, the data input/output operation can be carried out very quickly.

According to the invention, the above object is further achieved by providing a novel semiconductor memory device including a semiconductor chip divided into 9 or 3 by 3 regions having an equal area. Memory integrated circuits are arranged respectively in the 8 peripheral regions of the 9 regions except the central region and a logic integrated circuit arranged in the central region of the 9 regions, each of the 8 peripheral regions of the 9 regions being further divided into first, second and third sub-regions, the first and second sub-regions having a same contour with the third sub-region arranged therebetween. A memory cell array is arranged in each of the first and second sub-regions. A data input/output circuit sends out the output data from the memory cell array to an external element of the semiconductor chip and inputs the input data from an external element of the semiconductor chip into the memory cell array. A control circuit controls the operation of the data input/output circuit arranged in the third sub-region, a circuit for simultaneously addressing the memory cell arrays included in the 8 memory integrated circuits and a circuit for simultaneously specifying an operation mode to at least the control circuits included respectively in the 8 memory integrated circuits being arranged in the central region of the 9 regions.

With such a novel semiconductor memory device, a semiconductor chip is divided into 9 or 3 by 3 regions having an equal area and a logic integrated circuit is arranged at least in the central region of the 9 regions while memory integrated circuits, each including a memory cell array, are arranged respectively in the 8 peripheral regions except the central region. With this arrangement, the memory integrated circuits are separated from the logic integrated circuit with a substantially same distance to minimize the differences in the distance. Thus, a single logic integrated circuit can simultaneously control the 8 memory integrated circuits. Additionally, each of the 8 memory integrated circuits is divided into first, second and third sub-regions, the third sub-region being disposed between the first and second sub-regions. A memory cell array is arranged in each of the first and second sub-regions, while a data input/output circuit and a control circuit for controlling the data input/output operation of the data input/output circuit are arranged in the third region. Thus, the distance between each of the memory cell arrays and the related data input/output circuit can be minimized. Therefore, the speed of the operation of controlling the semiconductor memory cell having 8 memory integrated circuits can be maximized. Finally, since the distance between the memory cell array of each memory input/output and the related data input/output is minimized, the data input/output operation can be carried out very quickly.

According to the invention, the above object is further achieved by providing a novel method of driving a semiconductor memory device, the semiconductor memory device including a main control block for receiving an external address signal, an external command signal, an external clock signal and an external power supply potential and sending out an internal address signal, an internal command signal, an internal clock signal and an internal power supply potential. A plurality of memory blocks are controlled by the main control block, each of the plurality of memory blocks receiving the internal address signal, the internal command signal, the internal clock signal and the internal power supply potential. An input data supplied from an external element is written in a memory cell selected for data writing in synchronism with the internal clock signal and an output data is sent to an external element from a memory cell selected for data reading in synchronism with the internal clock signal. The method of driving a semiconductor memory device operates such that at least a data is read out from each of the plurality of memory blocks and all the read out data are sent out to an external element simultaneously.

With such a novel method of driving a semiconductor memory, since at least a data is read out from each of the plurality of memory blocks and all the read out data are sent out to an external element simultaneously, all the memory blocks are activated simultaneously. Thus, the effect of a method of driving a semiconductor memory device including a main control block and a plurality of memory blocks to be controlled by the main control block can be maximized.

According to the invention, the above object is further achieved by providing a novel circuit arrangement pattern including a main control block for receiving an external address signal, an external command signal, an external clock signal and an external power supply potential and sending out an internal address signal, an internal command signal, an internal clock signal and an internal power supply potential. A plurality of memory blocks are controlled by the main control block, each of the plurality of memory blocks receiving the internal address signal, the internal command signal, the internal clock signal and the internal power supply potential. An input data supplied from an external element is written in a memory cell selected for data writing in synchronism with the internal clock signal and an output data is sent to an external element from a memory cell selected for data reading in synchronism with the internal clock signal. The circuit arrangement pattern is structured such that each of the plurality of memory blocks is divided into three regions of a first circuit region, a second circuit region and a third circuit region arranged between the first and second circuit regions. The circuit arrangement pattern of the second circuit region is a mirror image of the circuit arrangement pattern of the first circuit region. The circuit arranged in the third circuit region is a circuit shared by the circuit arranged in the first region and the circuit arranged in the second region.

With such a novel circuit arrangement pattern, the wiring pattern of each memory block can be radially extended from the third circuit region toward the first and second circuit regions that are a mirror image of the other and the radially extended wiring pattern can be terminated within the memory block. When a memory block having such a circuit arrangement pattern is copied to produce a plurality of identical memory blocks, ineffective regions between adjacent memory blocks can be effectively eliminated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain principles of the present invention, in which.

DETAILED DESCRIPTION OF THE INVENTION

An embodiment of the present invention will be explained by a synchronous DRAM as an example with reference to FIG. 1.

Figure 1:
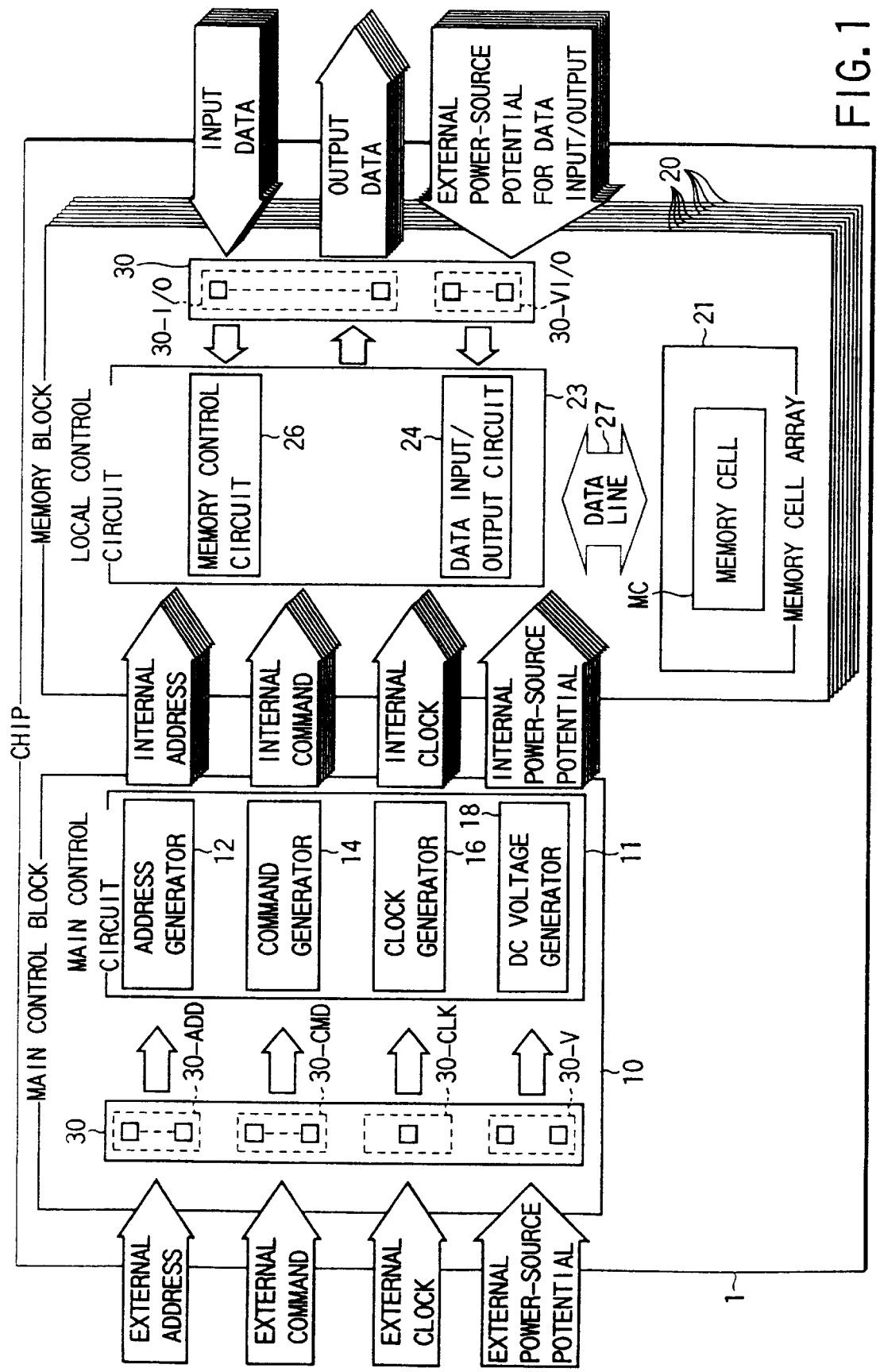
FIG. 1 is a block diagram of an embodiment of the invention, which is a synchronous DRAM, showing its basic configuration.

FIG. 1 is a structural view showing a fundamental configuration of a synchronous DRAM according to an embodiment of the invention.

As shown in FIG. 1, in the synchronous DRAM according to the invention, one chip is divided into a main control block 10 and a plurality of memory blocks 20. The main control block 10 is constituted to control the plurality of the main blocks 20, which are controlled by the main control block 10.

The main control block 10 includes a pad group 30 as an external terminal and a main control circuit 11. The pad group 30 receives an external address signal, an external command signal, an external clock signal and an external power source potential. The main control circuit 11 generates an internal address signal, an internal command signal, an internal clock signal and an internal power source potential according to the external address signal, the external command signal, the external clock signal and the external power source potential.

The pad group 30 includes an address signal pad group 30-ADD which is an input terminal of the external address signal, a command signal pad group 30-CMD which is an input terminal of the external command signal, a clock signal pad 30-CLK which is an input terminal of the external clock signal, and a power source pad group 30-V which is an input terminal of the external power source potential.

The main control circuit 11 includes an address generator 12 for generating an internal address signal according to the input external address signal, a command generator 14 for generating an internal command signal according to the input external command signal, a clock generator 16 for generating an internal clock signal according to the input external clock signal, and a DC voltage generator 18 for generating an internal power source potential according to the input external power source potential, Each of the plurality of the memory blocks 20 includes a pad group 30 as an external terminal, a memory cell array 21 and a local control circuit 23. The pad group 30 receives input/output data and an external power source potential for data input/output. The memory cell array 21 includes a plurality of memory cells MC for storing data. The local control circuit 23 receives an internal address signal, an internal command signal, an internal clock signal and an internal power source potential, writes the input data in synchronization with the internal clock signal in a selected memory cell MC of the plurality of the memory cells MC, reads the data from the selected memory cell MC of the plurality of the memory cells MC, and outputs the data in synchronization with the internal clock signal.

The pad group 30 includes an I/O pad group 30-I/O which is a data input/output terminal, and a power source pad group 30-VI/O which is an internal terminal of the external power source potential for data input/output. The memory cell array 21 includes a plurality of dynamic memory cells MC connected to the local control circuit 23 via a data line 27.

The local control circuit 23 includes a data input/output circuit 24 for inputting/outputting data to an input/output terminal in synchronization with the internal clock signal in response to the internal command signal, and a memory control circuit 26 for writing data in a specific memory cell MC of the plurality of the memory cells MC and for reading the data from the specific memory cell MC in synchronization with the internal clock signal in response to the internal command signal and the internal address signal.

The data input/output circuit 24 includes an I/O buffer (not shown) and an I/O control circuit (not shown) for controlling the I/O buffer. The I/O control circuit is operated by the internal power source potential generated by the DC voltage generator 18, and the I/O buffer is operated by the data input/output external power source potential input to the power source pad group 30-VI/O.

The memory control circuit 26 includes a row decoder (not shown) and a column decoder (not shown) for designating an address in the memory cell array 21, a data transfer system circuit (not shown) including a DQ buffer, a data transfer system circuit control circuit (not shown) for controlling the data transfer system circuit, a bit line sense amplifier and a bit line control circuit (not shown) for controlling a bit line equalizer. The memory control circuit 26 is operated by the internal power source potential generated by the DC voltage generator 18.

Figure 2:
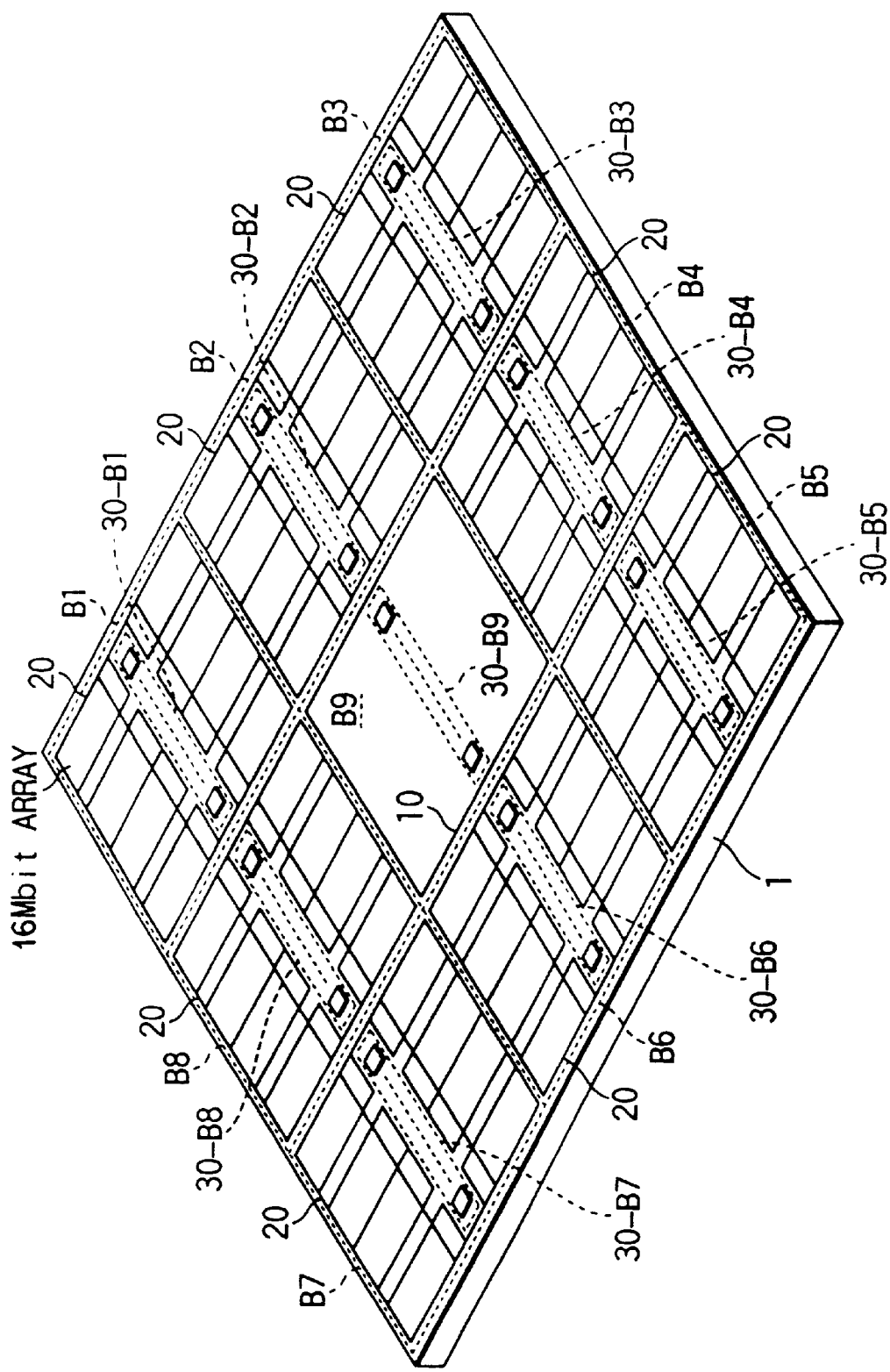
FIG. 2 is a perspective view of the embodiment of FIG. 1, which is a synchronous DRAM.

FIG. 2 is a perspective view showing an external appearance of a synchronous DRAM according to an embodiment of the invention.

As shown in FIG. 2, the entire chip 1 of the DRAM according to an embodiment is divided into nine areas B1 to B9 each having an equal area (equal shape) of three longitudinal blocks and three lateral blocks (3×3). The one central area B9 is a main control block 10, in which a main control circuit 11 is disposed. The eight areas B1 to B8 disposed at the periphery of the area B9 are main blocks 20, and a memory cell array 21 having a 128 Mbit storage capacity and a local control circuit 23 are disposed in each of the areas B1 to B8.

A pad group 30 is disposed in each of the areas B1 to B9. The pad group 30-B9 disposed in the area B9 includes an address signal pad group 30-ADD, a command signal pad group 30-CMD, a clock signal pad 30-CLK and a power source pad group 30-V, as shown in FIG. 1. Each of the pad groups 30-B1 to 30-B8 disposed in the areas B1 to B8, respectively includes an I/O pad group 30-I/O, and a power source pad group 30-VI/O. The pad groups 30-B1 to 30-B8 are respectively used in the same areas.

One detailed configuration of the main control block 10 will now be explained.

Figure 3:
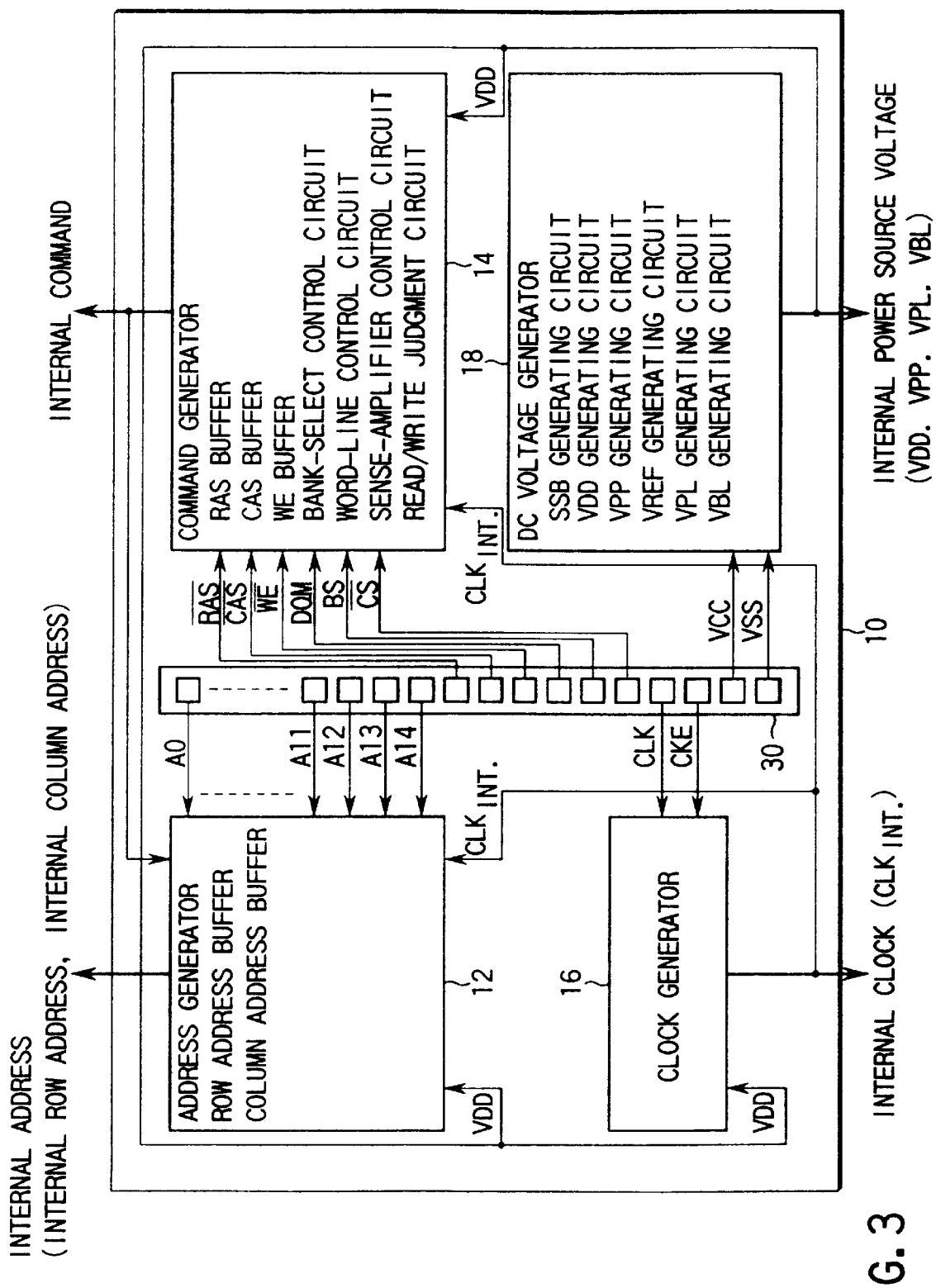
FIG. 3 is a block diagram of the main control block 10 of the embodiment of FIG. 1.

FIG. 3 is a block diagram of the main control block 10. As shown in FIG. 3, the DC voltage generator 18 receives an external DC voltage (VCC, VSS), generates an internal DC voltage according to the external DC voltage, and outputs the generated internal DC voltage to the areas B1 to B8 and B9.

The DC voltage generator 18 includes an SSB generator for generating a substrate potential SSB according to an external high potential VCC (or external group potential VSS), a VDD generator for generating an internal high potential VDD according to the external high potential VCC, a VPP generator for generating a boosted potential VPP according to the external high potential VCC (or the internal high potential VDD), a VREF generator for generating a reference potential VREF according to the external high potential VCC (or the internal high potential VDD), a VPL generator for generating a plate potential VPL according to the external high potential VCC (or the internal high potential VDD), and a VBL generator for generating a precharge potential VBL according to the external high potential VCC (or the internal high potential VDD).

The clock generator 16 receives an external clock signal (CLK) and generates an internal clock $CLK_{INT}$ according to the external clock input, and outputs the generated internal clock $CLK_{INT}$ to the areas B1 to B9.

The command generator 14 fetches the external command signals ($\overline{RAS}$, $\overline{CAS}$, $\overline{WE}$, DQM, BS, $\overline{CS}$) in synchronization with the internal clock signal $CLK_{INT}$ and generates the internal command signal according to the fetched external command signal, and outputs the internal command signal to the areas B1 to B9. The command generator 14 includes a RAS buffer, a CAS buffer, a WE buffer, a bank select control circuit for selecting a bank, a word line control circuit for controlling a word line, a sense amplifier control circuit for controlling a sense amplifier, and a read/write discriminator for discriminating a write mode or a read mode.

The address generator 12 fetches address inputs A0 to A14 in synchronization with the internal clock $CLK_{INT}$ generates an internal address in response to the state of the internal command signal according to the fetched address input, and outputs the internal address to the areas B1 to B8. The address generator 12 includes a row address buffer and a column address buffer.

One example of a configuration of the pad group 30 (30-B9) includes, as shown in FIG. 3, fifteen pads for the external addresses, six pads for the external command, two pads for the external clock and two pads for the external power source, for a total of twenty-five pads.

In the specification, the two types of signals "CLK" and "CKE" input to the clock generator 16 are defined as "a clock signal group", the six types of signals "BS", "$\overline{CS}$", "DQM", "$\overline{RAS}$", "$\overline{CAS}$", and "$\overline{WE}$" are defined as "an external command signal group", and "A0 to A14" input to the address generator 12 are defined as "an address signal group".

The signal "CLK" is a clock input, and hence an operating reference clock. All the functions are executed in synchronization with, as an example, an up-edge of the clock input CLK.

The signal "CKE" is clock enabled, and the clock input CLK is used for the purpose of suspending the clock input CLK therein. When the clock enable is at a "L" level, the clock input CLK is suspended, and the DRAM holds the state at that time.

The signal "BS" is a bank select, and designates an operation for either a bank #0 or a bank #1 of the two banks. When the bank select BS is at a "L" level, the bank #0 is designated, and when the bank select BS is at a "H" level, the bank #1 is designated.

The signal "$\overline{CS}$" is a chip select, and controls the fetching of the command. When the chip select "$\overline{CS}$" is at a "L" level, the command is fetched at the up-edge of the clock input CLK. When the chip select "$\overline{CS}$" is at a "H" level, the command is not fetched.

The signal "DQM" is an output disable/write mask. The "DQM" is operated as an output control signal in the case of a read cycle. When the "DQM is at a "H" level at the up-edge of the clock input CLK, the data output at the up-edge of the next clock input CLK is disabled. Contrary, in the case of a write cycle, "DQM" is operated as an input data mask. When the "DQM" is at a "H" level at the up-edge of the clock input CLK, the write data is masked.

The signal "$\overline{RAS}$" is a row address strobe, the signal "$\overline{CAS}$" is a column address strobe, and the signal "$\overline{WE}$" is a write enable. These three signals form an operation command, which is fetched at the up-edge of the clock input CLK.

When the signals "$\overline{RAS}$" and the "$\overline{CAS}$" are respectively at "L" and "H" levels, it becomes a "$\overline{RAS}$" command. this time, the write enable $\overline{WE}$ is at the "H" level, and becomes a bank activation command, and the bank designated by the bank select BS becomes active. Whereas, then the write enable is at a "L" level, $\overline{WE}$ becomes a precharge command, and the bank becomes an idle state.

When the signals "$\overline{RAS}$" and "$\overline{CAS}$" are respectively "H" and L", it becomes a "$\overline{CAS}$" command, and a column cycle is started. At this time, when the write enable $\overline{WE}$ is at a "H" level, it becomes a read cycle and when the write enable $\overline{WE}$ is at a "L" level, it becomes a write cycle.

These external clock signal groups and the external command signal groups are examples only. For instance, regarding the external command signal group, in addition to the signals of the above-mentioned six types, another signal may be added or some of the above-mentioned external command signals may be replaced with other signals.

Figure 4:
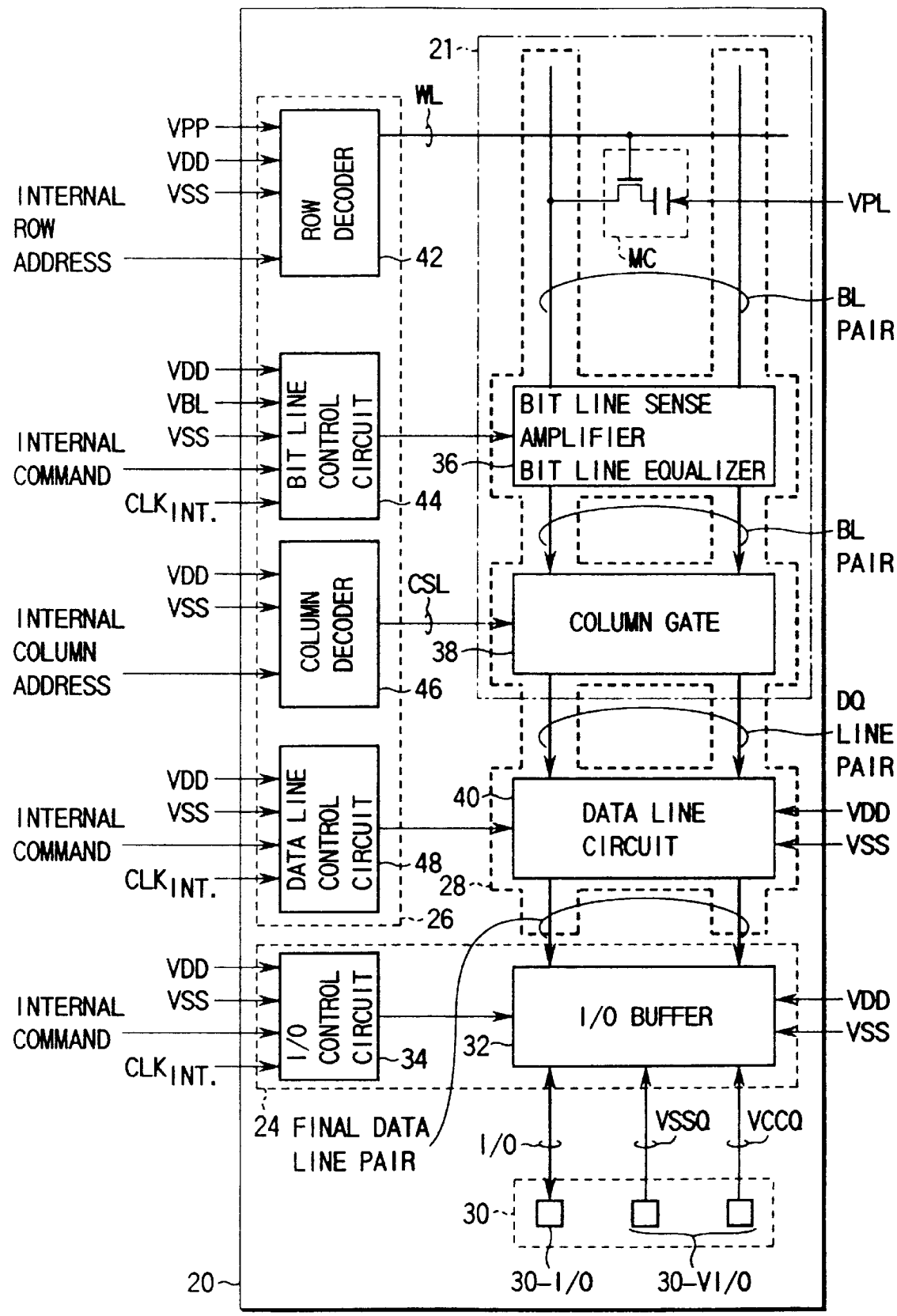
FIG. 4 is a block diagram of one of the memory blocks 20 of the embodiment of FIG. 1.

One more detailed configuration of a memory block 20 will now be explained. FIG. 4 is a block diagram of the memory block 20.

As shown in FIG. 4, the memory block 20 includes a memory cell MC, a data input/output circuit 24, a memory control circuit 26 for selecting the memory cell MC according to the internal address signal and transferring the selected data of the memory cell MC to the data input/output circuit 24 according to the internal command, and a data transfer system circuit 28 controlled by the memory control circuit 26 for connecting the memory cell MC to the data input/output circuit 24.

The data transfer system circuit 28 includes a bit line sense amplifier/bit line equalizer 36 connected to a bit line pair (BL pair), a column gate 38 for connecting the bit line pair to DQ line pair, and a data line circuit 40 for connecting the DQ line pair to a final data line pair.

The data input/output circuit 24 includes an I/O buffer 32 for connecting a final data line pair to the I/O pad 30-I/O, and an I/O control circuit 34 for controlling the I/O buffer 32 according to the internal command signal and the internal clock $CLK_{INT}$. The I/O buffer 32 includes an output buffer for supplying output data from the data transfer system circuit 28 to the I/O pad 30-I/O, and an input buffer for supplying input data from the I/O pad to the data transfer system circuit 28. The output buffer is operated by a potential difference between an external potential VCCQ supplied to the output power source terminal supplied from an external element and an external potential VSSQ. The input buffer and the I/O control circuit 34 are operated by a potential difference between an internal potential VDD supplied from the DC voltage generator 18 and an internal potential VSS.

The memory control circuit 26 includes a row decoder 42 for selecting a row of the memory cell array according to an internal row address signal and activating a word line (WL) belonging to the selected row, a bit line control circuit 44 for controlling the bit line sense amplifier/bit line equalizer 36 according to an internal command signal and the internal clock $CLK_{INT}$, a column decoder 46 for selecting the column of the memory cell array according to an internal column address signal and activating the column gate 38 belonging to the selected column, and a data line circuit control circuit 48 for controlling the data line circuit 40 according to an internal command signal and the internal clock $CLK_{INT}$.

Figure 5:
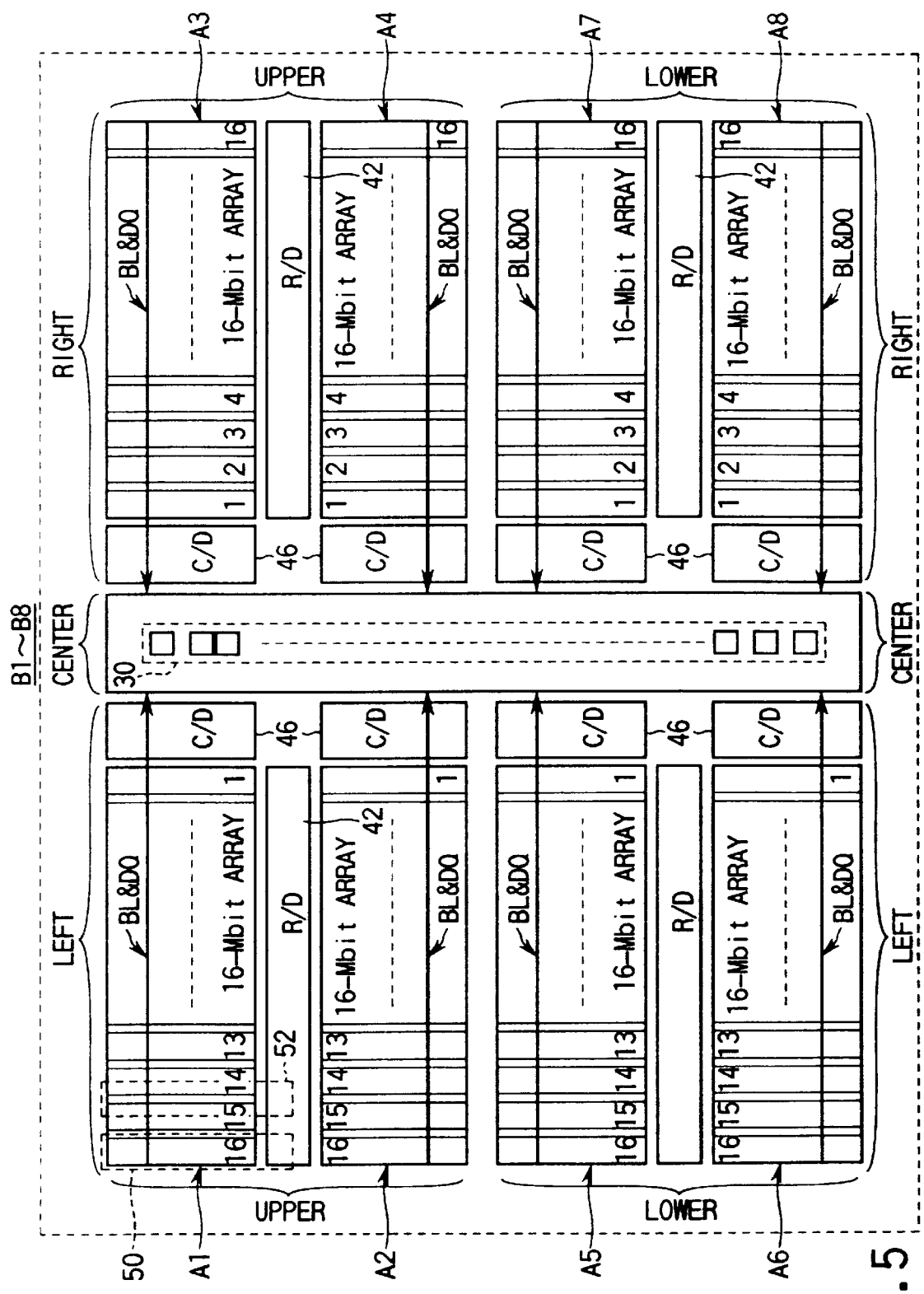
FIG. 5 is a plan view of the regions B1 through B8 of the embodiment of FIG. 1.

A layout of the memory block 20 will now be explained with reference to FIG. 5. FIG. 5 is a plan view of the areas B1 to B8. The memory blocks 20 disposed in the areas B1 to B8, respectively, each have a layout shown in FIG. 5 to be common.

As shown in FIG. 5, the layout of the memory block 20 is largely divided into three areas of a LEFT area, a RIGHT area and a CENTER area between the LEFT area and the RIGHT area. A circuit disposing pattern of the LEFT area and a circuit disposing pattern of the RIGHT area are disposed in a mirror image relation from each other. Further, the LEFT area and the RIGHT area are each respectively divided into UPPER areas and LOWER areas.

The memory block 20 includes 16 Mbit arrays A1 to A8. In the LEFT area, 16 Mbit arrays A1, A2, A5, A6 are disposed on one row. In the RIGHT area, 16 Mbit arrays A3, A4, A7, A8 are disposed in one row.

A column decoder (C/D) 46 is disposed between the 16 Mbit arrays A1 to A8 and the CENTER area. Two row decoders (RID) 42 are respectively provided in the UPPER area and the LOWER area, for a total of four, and are disposed between the 16 Mbit array and the 16 Mbit array.

Figure 6:
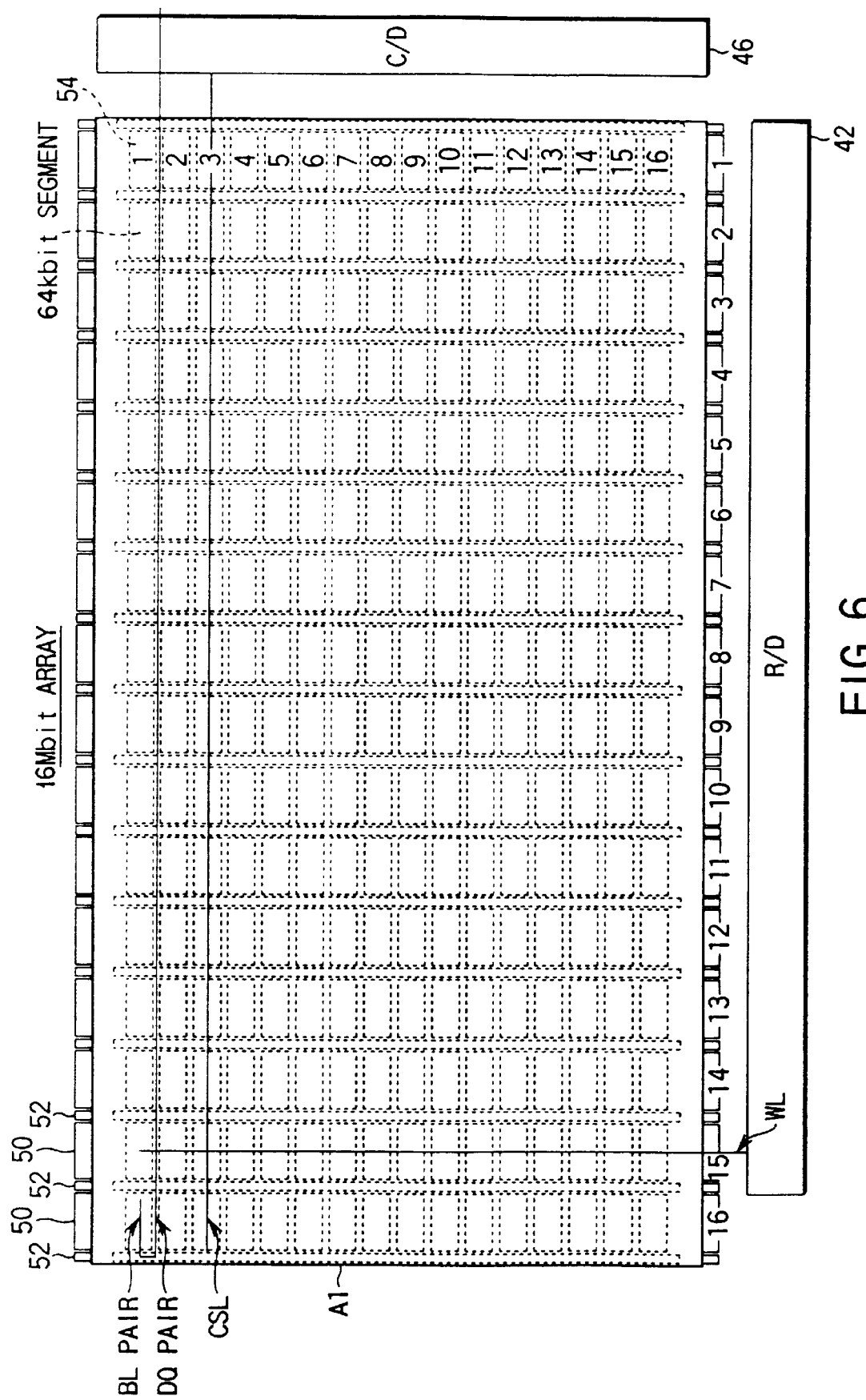
FIG. 6 is a plan view of one of the 16 M arrays of the embodiment of FIG. 1.

FIG. 6 is a plan view of a 16 Mbit array A1 to A8.

As shown in FIG. 6, the 16 Mbit array A1 is divided into sixteen 1 Mbit blocks 50 and sense amplifier array areas 52 disposed at both ends of the 1 Mbit block 50. Further, the 1 Mbit block 50 is divided into sixteen 64 Kbit segments 54. The other 16 Mbit arrays A2 to A8 have similar configurations. The bit line pair (BL pair) is disposed from one 64 Kbit segment 54 to one sense amplifier array area 52. The DQ line pair (DQ pair) is disposed from an endmost sense amplifier array area 52 of the 16 Mbit array to the CENTER area (not shown) between the 64 Kbit segments 54 over the column decoder (C/D) 46. A column select line (CSL) is disposed from the column decoder 46 to the endmost sense amplifier array area 52 of the 16 Mbit array over the 64 Kbit segment 54. The word line (WL) is disposed from the row decoder (RID) 42 to the 64 Kbit segment of the first row over the 64 Kbit segment 54.

Figure 7:
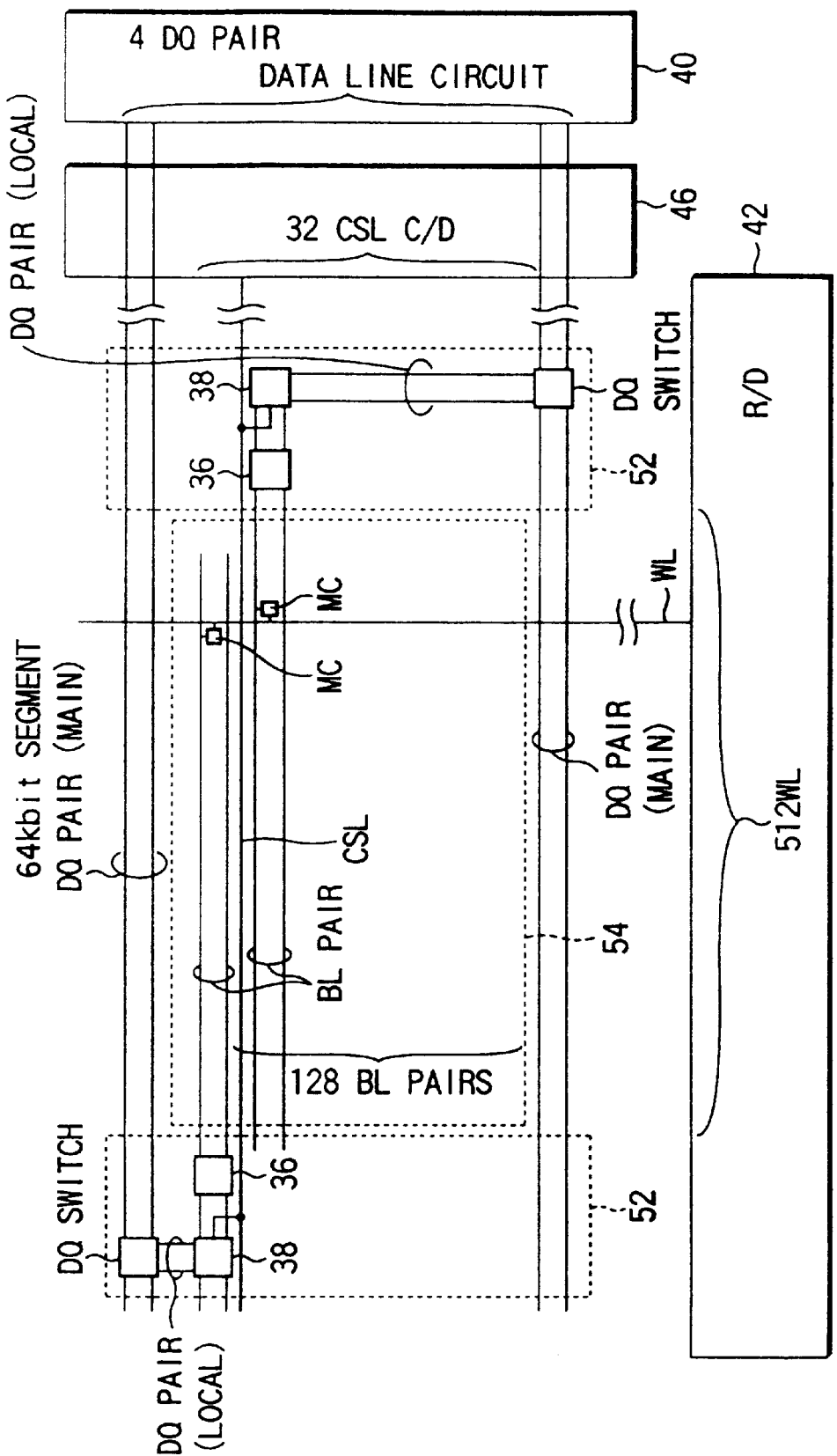
FIG. 7 is a block diagram of one of the 64k segments of the embodiment of FIG. 1.

FIG. 7 is a block diagram of the 64 Kbit segment 54.

As shown in FIG. 7, the memory cell MC is disposed at the 64 Kbit segment 54. In the sense amplifier array area 52, a sense amplifier/equalizer 36, a column gate 38 and a DQ switch are disposed. The bit line pair connects the drain of the memory cell MC to a column gate 38 via the sense amplifier/equalizer 36. The DQ line pair connects the column gate 38 to the data line circuit 40 through the DQ switch. Herein, from the column gate 38 to the DQ switch is referred to as "a local DQ line pair", and from the DQ switch to the data line circuit 40 is referred to as a "main DQ line pair". The local DQ line pair is provided at each 1 Mbit block. The main DQ line pair connects the local DQ line pair through the DQ switch. The DQ switch is a switch for determining which of the local DQ line pairs is connected to the main DQ line pair, i.e., which 1 Mbit block of the sixteen 1 Mbit blocks is connected to the data line circuit. The column select line CSL connects the column decoder 46 to the column gate 38, and gives a column select signal from the column decoder 46 to the column gate 38. The column select lines CSL, the main DQ line pair and the BL line pair are disposed in parallel on the 16 Mbit array. The word line connects the gate of the memory cell MC to the row decoder 42.

The one 64 Kbit segment 54 may include 512 word lines and 128 pairs of bit lines to form addresses of 65,536 words. 128 pairs of the bit lines are multiplexed to four pairs of DQ lines by using 32 column select signals.

Figure 8:
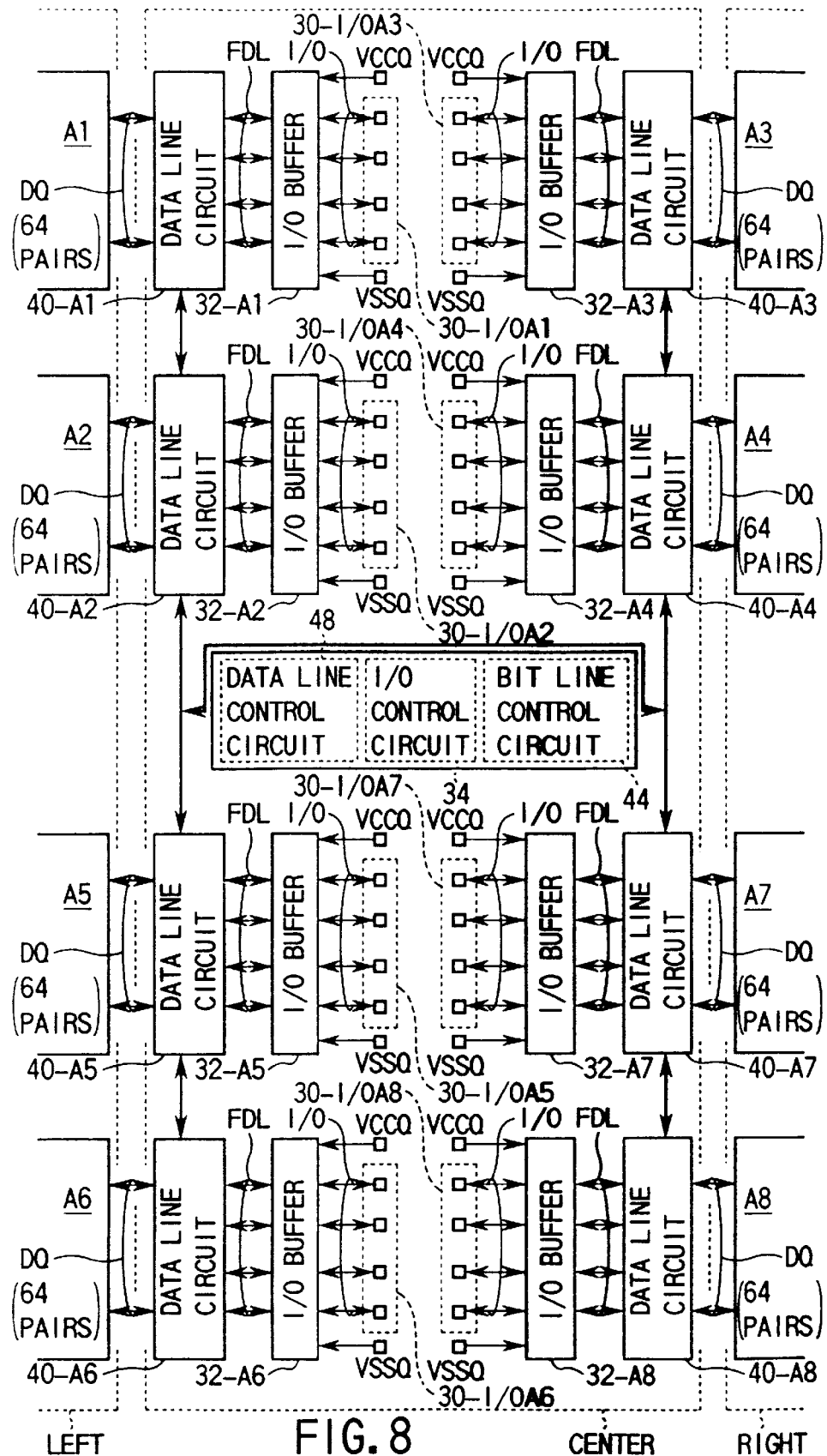
FIG. 8 is a block diagram of the CENTER region of one of the memory blocks 20 of the embodiment of FIG. 1.

FIG. 8 is a block diagram of the CENTER area of the memory block 20.

As shown in FIG. 8, in the CENTER area, a pad group 30, an I/O buffer 32, an I/O control circuit 34, a data line circuit 40, a bit line control circuit 44 and a data line control circuit 48 are disposed.

In the DRAM of one embodiment, the data line circuit 40 is provided in each of 16 Mbit arrays A1 to A8 (40-A1 to 40-A8), and the I/O buffer 32 is provided in each of the data line circuits 40-A1 to 40-A8 (32-A1 to 32-A8). The I/O buffers 32-A1 to 32-A8 each have a power source for an I/O buffer. The power sources for the I/O buffers are obtained by external potentials VCCQ, VSSQ. The I/O buffers 32-A1 to 32-A8 are respectively connected to I/O pads 30-I/OA1 to 30-I/OA8 including four I/O pads. In the DRAM according to an embodiment, the pads formed at one pad group 30 include 32 I/O pads and 8 VCCQ pads and 8 VSSQ pads, for a total of 48 pads. In the case of such a pad configuration, one I/O buffer 32-A includes 4 sets of an input buffer/output buffers, and all the I/O buffers 32-A1 to 32-A8 include totally 32 sets of an input buffer/output buffer.

The power sources VCCQ, VSSQ for the I/O buffers are connected to the output buffers, which are operated by the power sources VCCQ, VSSQ for the I/O buffers. The power sources VCCQ, VSSQ for the I/O buffers are input directly to the output buffers as the power sources of the output buffers. However, after the power source VCCQ for the I/O buffers is once input to the internal power source generator, this power source VCCQ is converted to VDDQ for the I/O buffers by the internal power source generator and then may be input to the output buffers. At this time, the internal power source generator for generating the power source VDDQ for the I/O buffers is not disposed in the main control block 10, but is disposed in each block memory 20. In FIG. 2, the example in which the pad groups 30-B1 to 30-B8 are formed on one row is shown. However, as shown in FIG. 8, the pad groups 30-B1 to 30-B8 may be formed in two rows. Similarly, as to the pad group 30-B9 shown in FIG. 2, two rows may be formed to match the pad groups 30-B1 to 30-B8.

The bit configuration of the DRAM according to an embodiment of the invention will now be explained.

The elements "A0 to A14" shown in FIG. 3 are external address inputs.

The DRAM according to one embodiment may include eight memory blocks 20 each having a 128 Mbit storage capacity as described above to provide 1 G storage capacity. Further, the one memory block 20 may include 8 16 Mbit arrays A (A1 to A8) to provide 128 Mbit storage capacity. Moreover, the one 16 Mbit array may include 16 1 Mbit blocks 50 each having 1 Mbit storage capacity to provide 16 Mbit storage capacity. Furthermore, one 1 Mbit block 50 may include 16 64 Kbit segments 54 each having 64 Kbit storage capacity to provide 1 Mbit storage capacity.

16 Mbit arrays A1 to A8 thus each have addresses of 16,777,216 words, which are obtained, for example, by 8192 (512×16) word lines and 2048 pairs (128×16) of bit lines.

For the 8192 word lines, the 8192 rows are selected by using 13-bit row addresses ($A0_R$ to $A12_R$). The 2048 pairs of bit lines are multiplexed by 64 pairs of DQ lines by decoding 5-bit column address ($A0_C$ to $A4_C$) by the column decoder 46.

As shown in FIG. 8, 64 pairs of DQ lines are multiplexed by four pairs of final data lines (FDL) of the data line circuits 40-A1 to 40-A8. This is conducted by total 9-bit ($A0_C$ to $A8_C$) column addresses by using 4-bit column addresses ($A5_C$ to $A8_C$). The four pairs of final data lines (FDL) are respectively connected to the I/O pad groups 30-I/OA1 to 30-I/OA8 through the I/O buffers 30-A1 to 32-A8 at each of the 16 Mbit arrays A1 to A8.

When the DRAM chip according to one embodiment is accessed by 13-bit row address and 9-bit column address, 32 data per one memory block, totally 256 data, can be simultaneously input and output. Thus, the DRAM according to one embodiment includes a "x256-bit configuration".

The bit configuration of a DRAM according to one embodiment can be further altered as follows.

When 64 pairs of DQ lines are multiplexed by total 10-bit column addresses ($A0_C$ to $A9_C$) to two pairs of final data lines (FDL) by further using 5 bits ($A5_C$ to $A9_C$) of the data line circuits 40-A1 to 40-A8, a DRAM according to one embodiment becomes a "x128-bit configuration".

When 64 pairs of DQ lines are multiplexed to a pair of final data lines (FDL) by further using 6-bit column addresses ($A5_C$ to $A10_C$) of the data line circuits 40-A1 to 40-A8, a DRAM according to one embodiment becomes a "x64-bit configuration".

Further, when the "x64-bit configuration" or less is provided, it is devised as follows.

First, the data line circuits 40-A1 and 40-A2, the data line circuits 40-A3 and 40-A4, the data line circuits 40-A5 and 40-A6 and the data line circuits 40-A7 and 40-A8 are respectively linked. Thus, for the DQ lines from the two 16 Mbit array, a total 128 pairs of DQ lines are multiplexed to a pair of final data lines (FDL) by using 7-bit column addresses ($A5_C$ to $A11_C$) of the data line circuits 40 linked to each other. Thus, 4 data can be output from the one memory block 20. In this manner, a DRAM according to one embodiment becomes a "x32-bit configuration".

Further, the data line circuits 40-A1, 40-A2, 40-A5, and 40-A6 are linked to each other, and the data line circuits 40-A3, 40-A4, 40-A7 and 40-A8 are linked to each other. Thus, for the DQ lines from 4 16 Mbit, a total 256 pairs of DQ lines are multiplexed to a pair of final data lines (FDL) by further using 8-bit column addresses ($A5_C$ to $A12_C$) of the data line circuits 40 linked to each other. Thus, two data can be output from the one memory block 20. In this manner, a DRAM according to one embodiment becomes a "x16-bit configuration".

Furthermore, all the data line circuits 40-A1 to 40-A8 are linked. Thus, for the DQ lines from all the 16 Mbit arrays of the memory block 20, a total 512 pairs of DQ lines are multiplexed to a pair of final data lines (FDL) by further using 9-bit column addresses ($A5_C$ to $A13_C$) of the data line circuits 40 linked to each other. Thus, only one data is output from the one memory block 20, and a DRAM according to one embodiment becomes a "x8-bit configuration".

Only the selected memory block 20 of 8 memory blocks 20 can be activated. To select the memory block 20 to be activated, 2-bit row addresses ($A13_R$, $A14_R$) and 1-bit column address ($A14_C$) may be used. When the memory block is selected, a "x4-bit configuration" or a "x1-bit configuration may" be provided.

When the above-mentioned bit configurations are set to switchable, a product manufactured in one manufacturing step can be altered in its specification at each bit-configuration to be convenient.

The alternation of the bit configuration is practical to conduct between the "x8-bit configuration" and the "x256-bit configuration". Because the memory block 20 which is non-active is presented between the "x4-bit configuration" and the "x1-bit configuration", the effect that 8 memory blocks 20 are formed in one chip is reduced.

The memory blocks 20 are divided into a plurality of banks in which data can be written and read independently according to an internal command signal. The plurality of banks are obtained by dividing, for example, a 16 Mbit array shown in FIG. 5 to bank #0 to bank #1. One example of dividing the 16 Mbit array to banks is that the bank #0 is divided into an even number of 1 Mbit blocks 50 and the bank #1 is divided into an odd number of the 1 Mbit blocks 50. The bank dividing of the 16 Mbit array may also be by other dividing schemes.

The layout of data line groups formed in the memory block 20 will now be explained.

Figure 9:
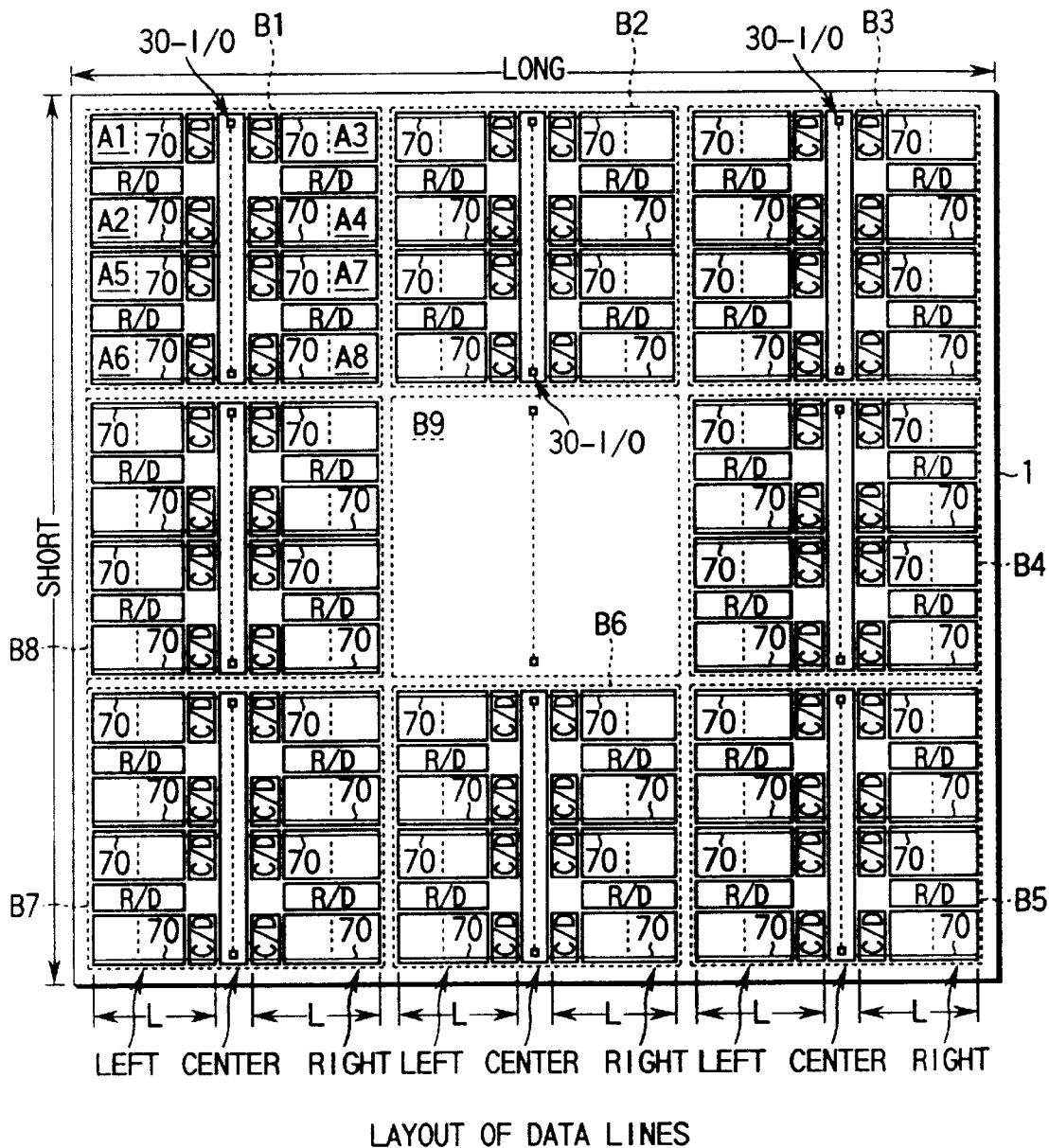
FIG. 9 is a plan view of a data line group that can be used for the embodiment of FIG. 1, which is a synchronous DRAM.

FIG. 9 is a plan view schematically showing the layout of data line groups of a synchronous DRAM according to an embodiment of the invention.

As shown in FIG. 9, data line groups 70 for connecting memory cells to I/O pad groups 30-I/O to each other are disposed from the CENTER area of areas B1 to B8 to the LEFT area and the RIGHT area of the areas B1 to B8. The data line groups 70 are wiring groups dispersively disposed in the areas B1 to B8, and do not extend, for example, to other areas. Input data to be input to the I/O pad group 30-I/O provided at each of the areas B1 to B8 are input to the memory cell in the same area through data line groups 70. Output data to the I/O group 30-I/O is output in the same areas through the data line group 70.

The I/O pad groups 30-I/O are disposed at the CENTER area sandwiched between the LEFT area in which 16 Mbit arrays A1, A2, A5, A6 are disposed and the RIGHT area in which 16 Mbit arrays A3, A4, A7, A8 are disposed. This CENTER area is disposed along the short side (SHORT) of the chip 1, and this area is an area for forming a control circuit in a background DRAM. However, in a DRAM according to one embodiment, the I/O pad group 30-I/O is provided at the CENTER area along the short side (SHORT) of the chip 1 so that a distance between the memory cell 21 and the I/O pads 30 is shorter. Accordingly, the wiring length L of the data line groups 70 can be shorter than that of the background DRAM. Further, since one memory block can be disposed by 3×3 in the chip 1, the wiring length L can be shortened to about ⅙ with respect to the long side (LONG) of the chip.

As described above, a transfer distance of data in the chip 1 can be shortened, the operation of the apparatus can be accelerated, and particularly the input and output operations of the data can be further accelerated by the layout of the data line groups 70 shown in FIG. 9.

The data line groups 70 shown in FIG. 9 are the generic name of bit lines, the local DQ line and the main DQ line (these bit lines, local DQ line and main DQ line are shown in FIGS. 6 and 7).

The layout example of the wirings between the blocks for connecting the main control block 10 to the memory block 20 will now be explained.

Figure 10:
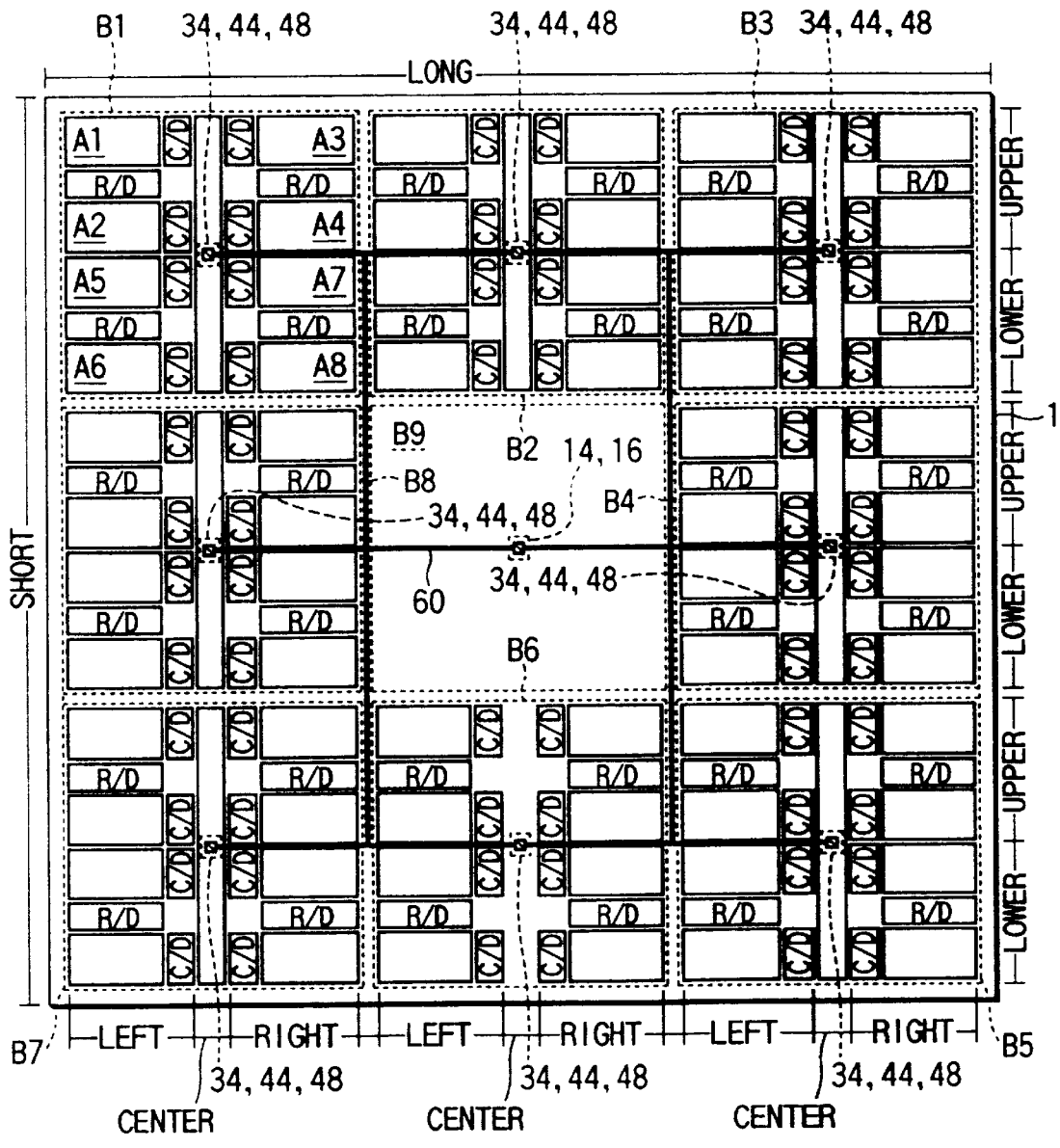
FIG. 10 is a plan view of an internal command signal line group that can be used for the embodiment of FIG. 1, which is a synchronous DRAM.

FIG. 10 is a plan view schematically showing the layout of the internal command signal line group and the internal clock line group of a synchronous DRAM according to one embodiment of the invention.

As shown in FIG. 10, a wiring group 60 to which an internal command signal and an internal clock signal are supplied is disposed from an area B9 to the CENTER areas of areas B1 to B8. The internal command signal and the internal clock signal respectively generated from the command generator 14 and the clock generator 16 are supplied to an I/O control circuit 34, a bit line control circuit 44 and a data line circuit control circuit 48 disposed in the CENTER area of the areas B1 to B8 through the wiring group 60.

The portion along the short side (SHORT) of the wiring group 60 is disposed between adjacent blocks, i.e., between the RIGHT area and the LEFT area. The wiring group 60 extends from the central block B9 to the peripheral blocks B1 to B8 by the layout. The portion along the long side (LONG) of the wiring group 60 is disposed between the UPPER area and the LOWER area. The wiring group 60 extends to the interiors of the peripheral blocks B1 to B8 by the layout.

Figure 11:
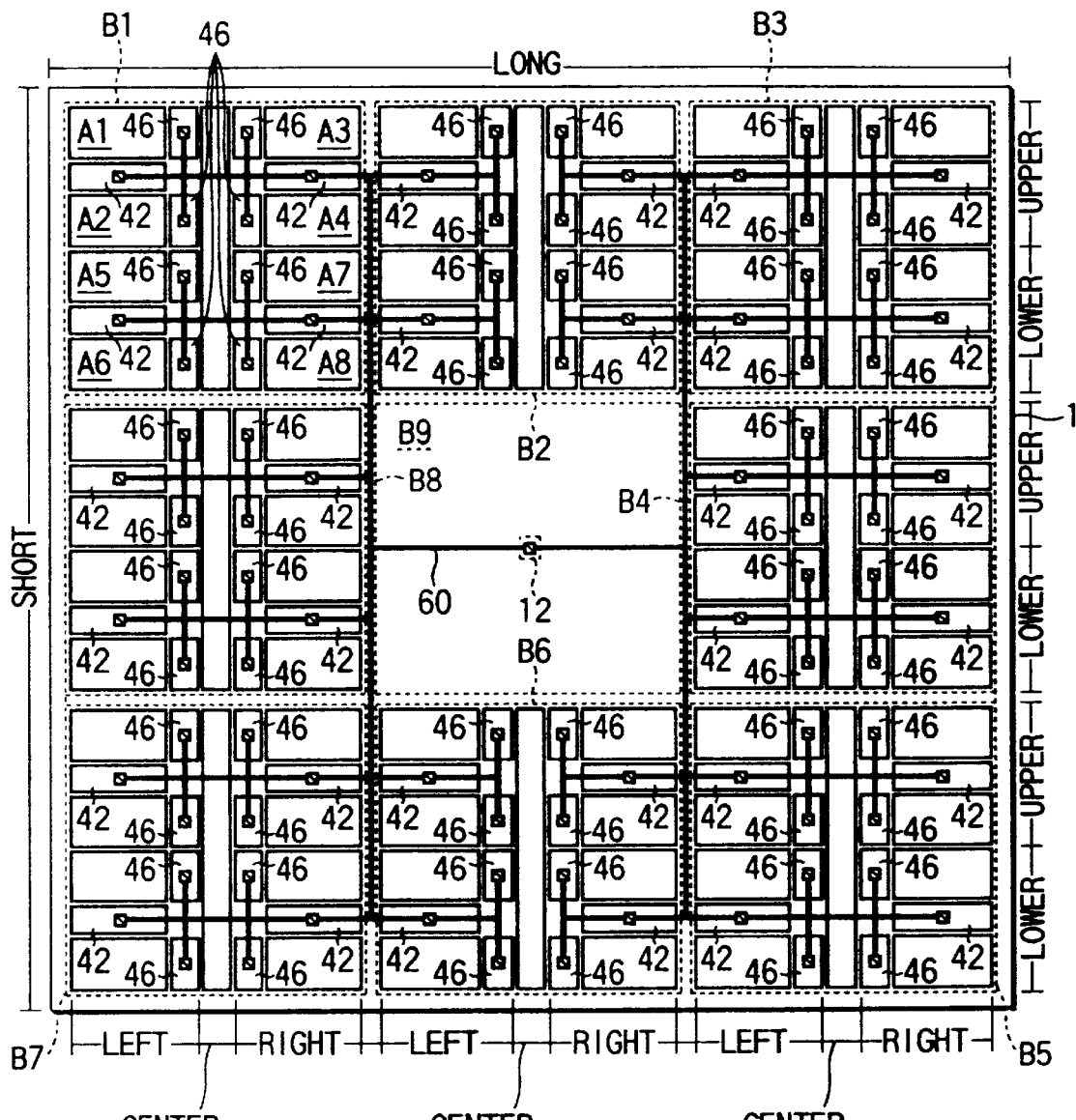
FIG. 11 is a plan view of an internal address signal line group that can be used for the embodiment of FIG. 1, which is a synchronous DRAM.

FIG. 11 is a plan view schematically showing the layout of the internal address signal group of a synchronous DRAM according to one embodiment of the invention.

As shown in FIG. 11, a wiring group 62 to which an internal address signal is supplied is disposed from the area B9 to the row decoders 42 and the column decoders 46 of the areas B1 to B8. The internal address signal generated from the address generator 12 is supplied to the row decoder 42 and the column decoder 46 disposed in the areas B1 to B9.

The portion along the short side (SHORT) of the wiring group 62 is disposed between the adjacent blocks, i.e., between the RIGHT area and the LEFT area. The wiring group 62 extends from the central area B9 to the peripheral areas B1 to B9 by this layout. The portion along the long side (LONG) of the wiring group 62 is disposed on the area where the row decoders 42 are respectively formed between the 16 Mbit arrays of the UPPER area and the 16 Mbit arrays of the LOWER area. The wiring group 62 extends to the interiors of the peripheral blocks B1 to B8 by this layout.

The layout example of wirings in a block formed in the memory block 20 will now be explained.

Figure 12:
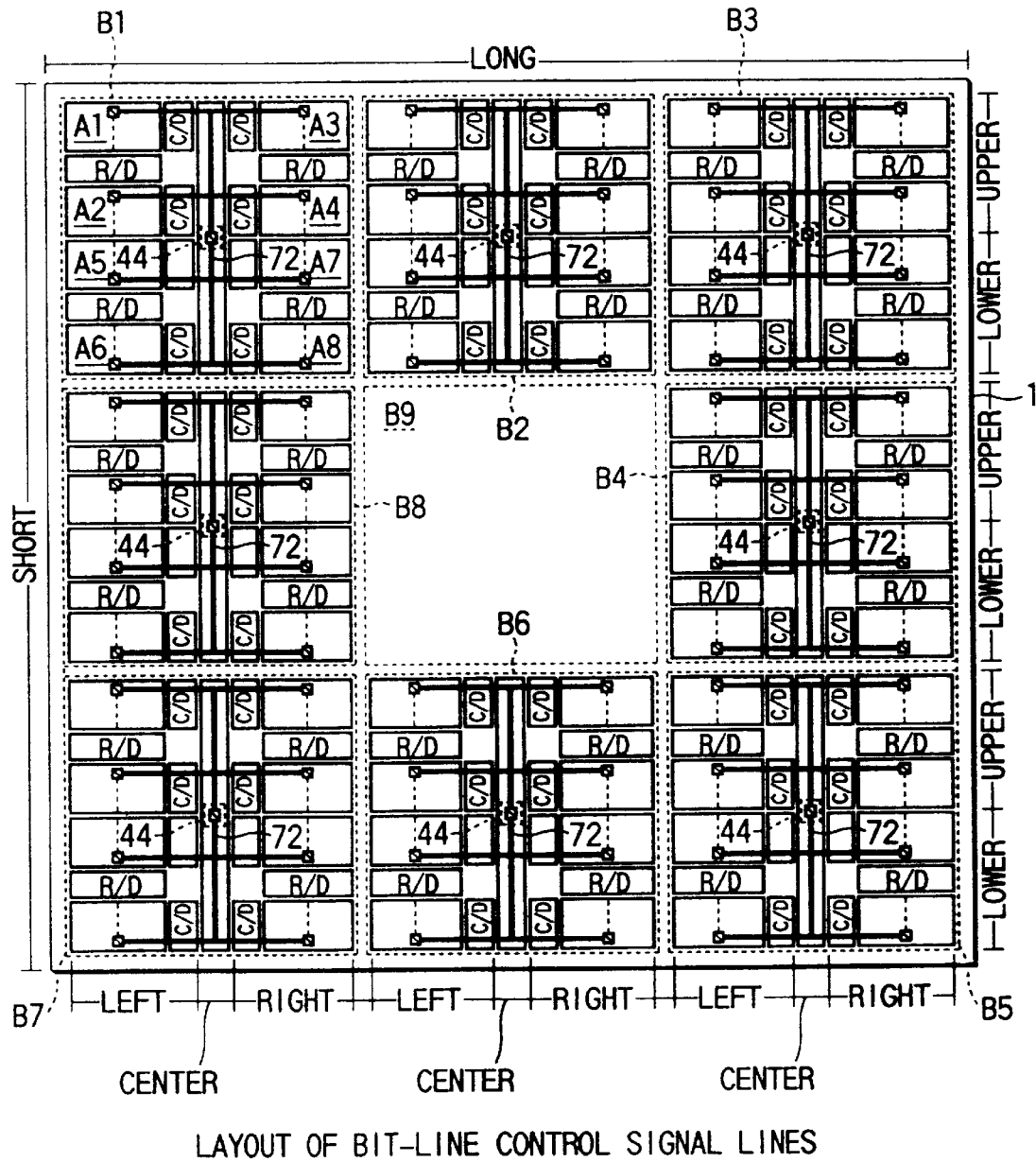
FIG. 12 is a plan view of a bit line control signal line group that can be used for the embodiment of FIG. 1, which is a synchronous DRAM.

FIG. 12 is a plan view schematically showing the layout of a bit line control signal line group of a synchronous DRAM according to one embodiment of the invention.

As shown in FIG. 12, the wiring groups 72 to which a bit line control signal is supplied is disposed from the CENTER area of the areas B1 to B8 to the LEFT areas and the RIGHT areas of the areas B1 to B8. The wiring groups 72 are a wiring group dispersively disposed in the areas B1 to B8, which do not extend, for example, to other areas. A bit line control signal generated by a bit line control circuit 44 provided at each of the areas B1 to B8 is supplied to a bit line sense amplifier/bit line equalizer in the same area through a respective wiring group 72.

The portion along the short side (SHORT) of a wiring group 72 is disposed at the CENTER area. Each wiring group 72 extends from the CENTER area to the 16 Mbit arrays A1 to A8 of both sides by this layout. The portion of the long side (LONG) of a wiring group 72 is disposed on the 16 Mbit array through the area formed with the column decoder (C/D) 46. Each wiring group 72 is disposed between 64 Kbit segments shown in FIG. 6 in the 16 Mbit array. Each wiring group 72 extends to the interiors of the 16 Mbit arrays A1 to A8 by this layout.

Figure 13:
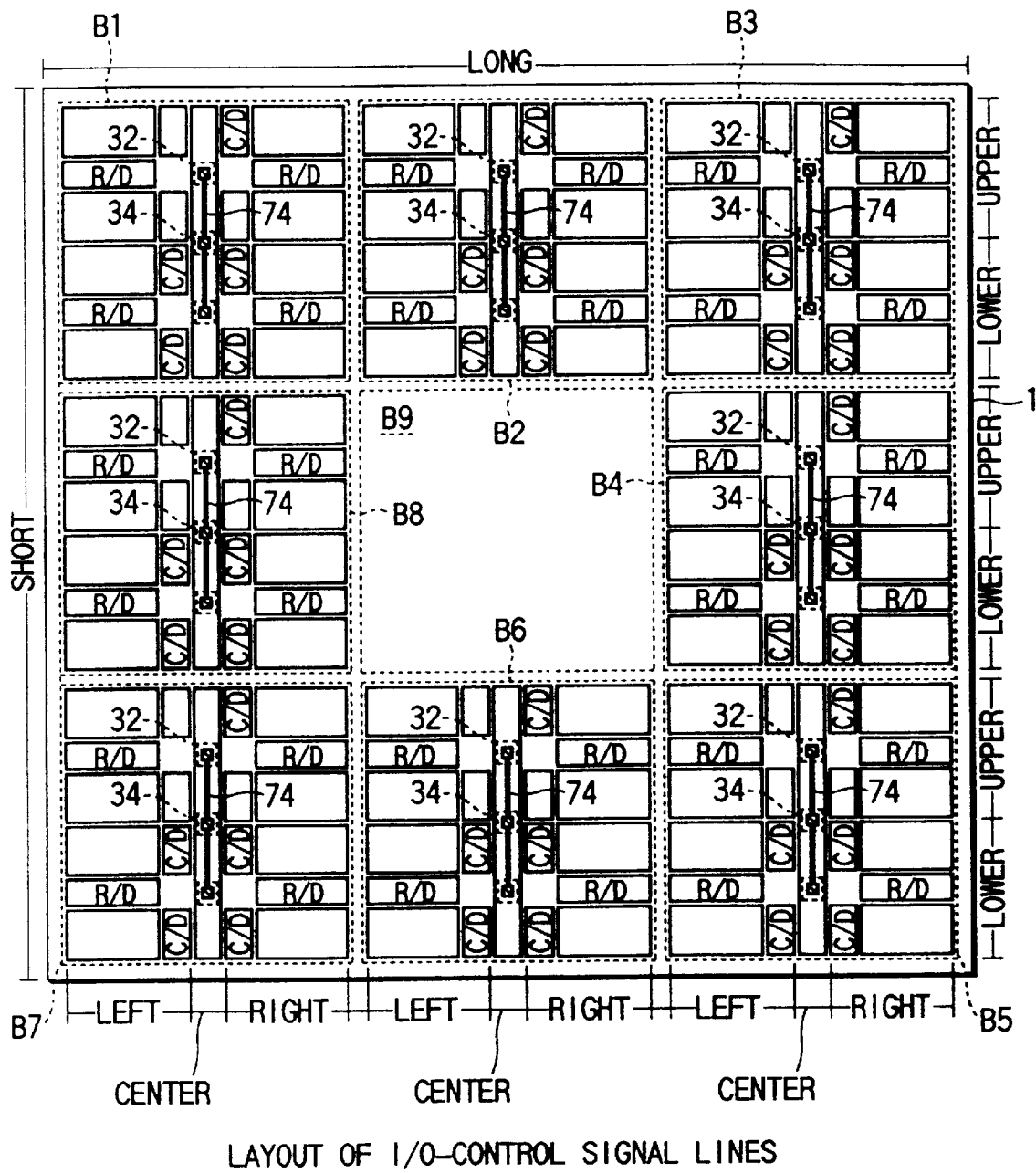
FIG. 13 is a plan view of an I/O control signal line group that can be used for the embodiment of FIG. 1, which is a synchronous DRAM.

FIG. 13 is a plan view schematically showing the layout of an I/O control signal line group of a synchronous DRAM according to one embodiment of the invention.

As shown in FIG. 13, a wiring group 74 to which an I/O control signal for controlling an I/O buffer is supplied is disposed in the CENTER area of each of the areas B1 to B8. Each wiring group 74 includes wirings dispersively disposed in the areas B1 to B8, which do not extend, for example, to other areas. An I/O control signal generated by an I/O control circuit 34 provided at each of the areas B1 to B8 is supplied to an I/O buffer 32 in the same area through a respective wiring group 74.

The portion along the short side (SHORT) of a wiring group 74 is disposed at the CENTER area. Each wiring group 74 extends to the I/O buffer 32 in the CENTER area by this layout.

In a DRAM according to one embodiment, a data line (FIG. 9) used to transfer data is closed at each memory block 20. Therefore, both input data (write data) and output data (read data) are transferred to the same memory block. A BL control signal line (FIG. 12) for controlling the transfer of the data and an I/O control signal line (FIG. 13) for controlling the data input/output are also closed at each memory block 20. Therefore, the data input and the data output are controlled only in the same memory block. Accordingly, even if the size of the chip 1 is increased due to an increase in the storage capacity, a decrease of the speed of the data input/output can be suppressed or further improved.

The layer structure of wirings between the blocks and wirings in the block will now be explained.

As shown in FIGS. 9 to 13, a DRAM according to one embodiment includes two types of wirings of the wirings between the blocks disposed from the area B9 to the areas B1 to B8 (the internal command signal line, the internal clock line, the internal address signal line), and the wirings in the block disposed only in the areas (the bit line, main/local DQ line, CSL line, WL line, BL control signal line, I/O control signal line). It is preferable to divide the wiring layer formed at the wirings between the blocks and the wirings in the block.

Figure 14:
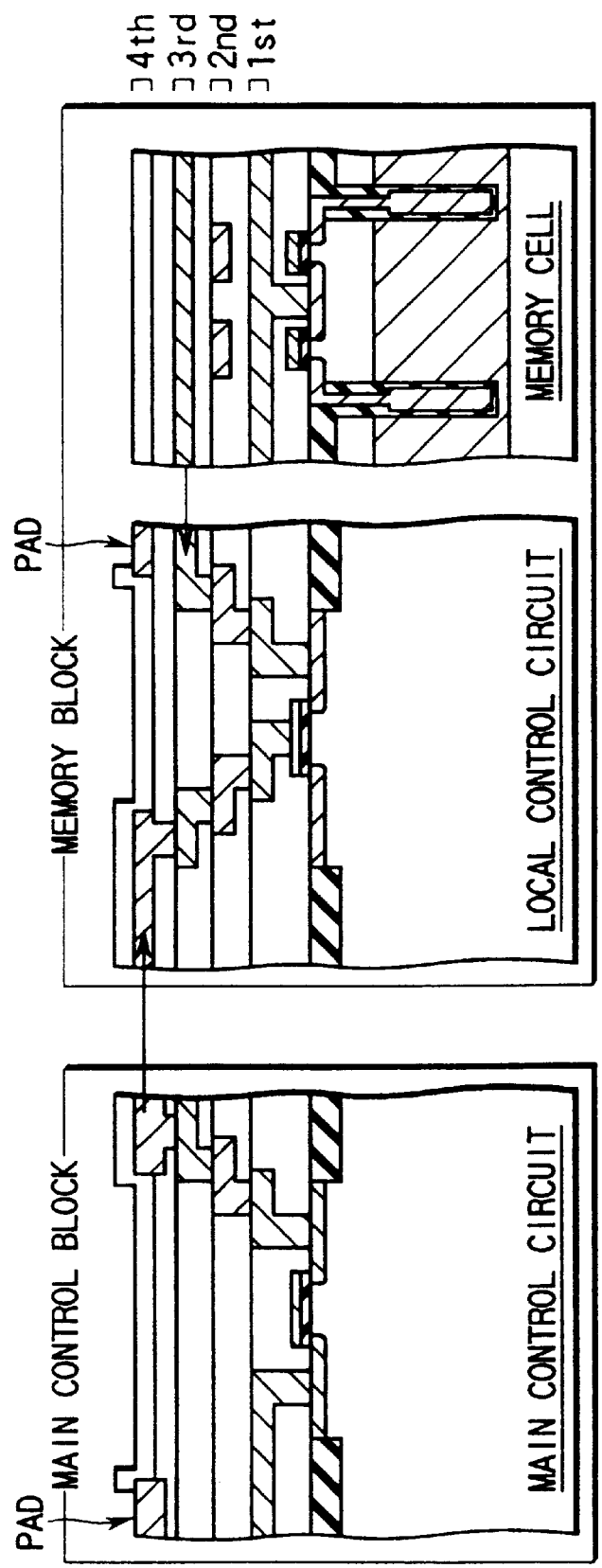
FIG. 14 is a sectional view of the layered structure of inter-block wires and intra-block wires that can be used for the embodiment of FIG. 1, which is a synchronous DRAM.

FIG. 14 is a sectional view schematically showing the layer structure of the wirings between the blocks and the wirings in the block included in a synchronous DRAM according to one embodiment of the invention.

As shown in FIG. 14, when four metal layers are used, the wirings between the blocks disposed from the area B9 to the areas B1 to B8 are formed by using the fourth metal layer of the uppermost layer. The wirings in the blocks are formed by using first to third metal layers. The pads are formed by using the fourth metal layer.

An embodiment of bonding the pad to the external terminal of a synchronous DRAM according to one embodiment of the invention will now be explained.

Since a pad group 30 is disposed in an entire chip 1 of the DRAM according to one embodiment, a wire bonding is difficult. Therefore, a flip-chip connection is used to bond the external terminal to the pad of the chip instead of a wire bonding.

Figure 15:
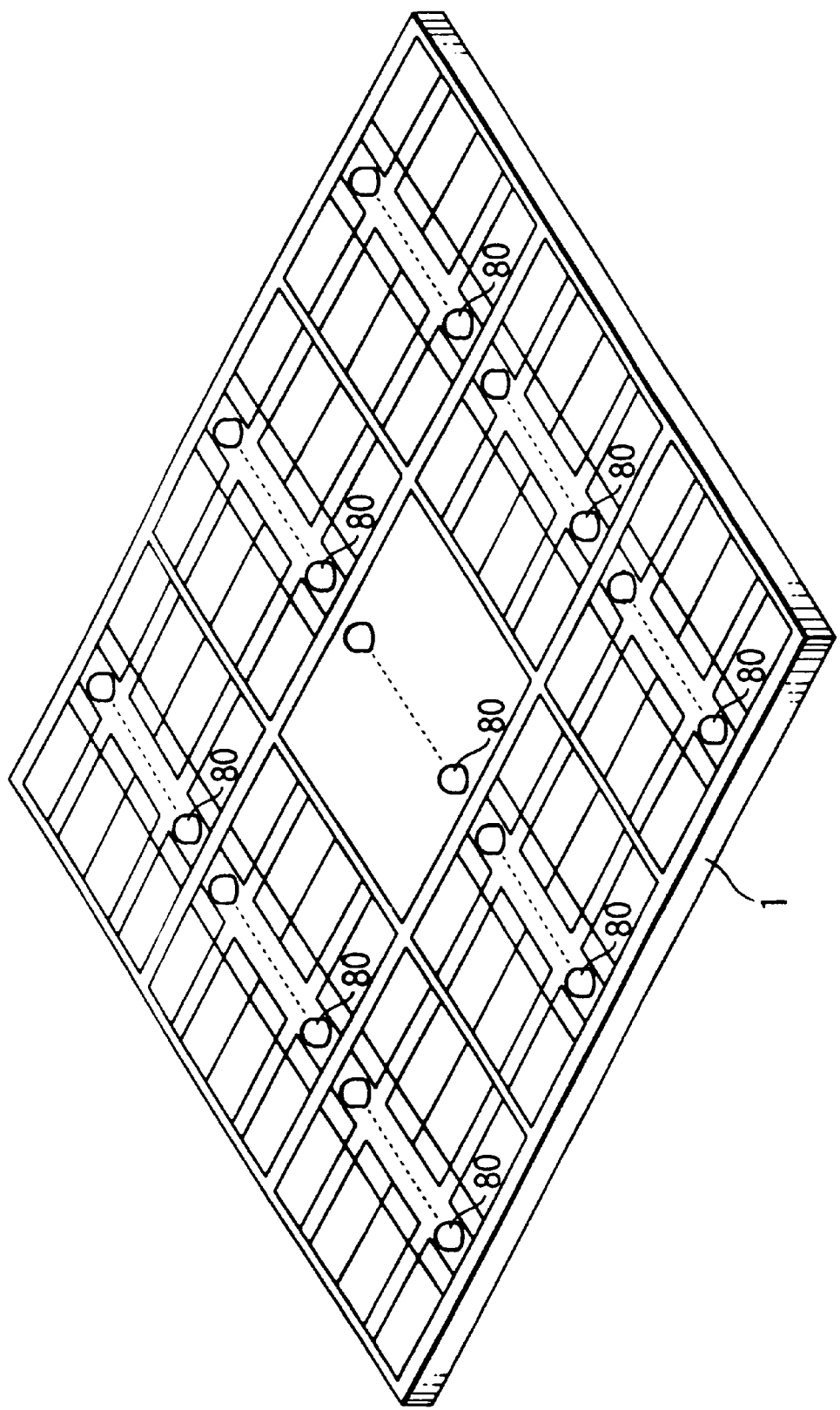
FIG. 15 is a perspective view of connection electrodes that can be used for the embodiment of FIG. 1, which is a synchronous DRAM.

FIG. 15 is a perspective view showing a connecting electrode of a synchronous DRAM according to one embodiment of the invention As shown in FIG. 15, solder balls 80 are formed on the pads. The solder balls 80 are connecting electrodes for connecting the external terminal of a package to the pads of the chip 1. Thus, the chip 1 of a DRAM according to one embodiment becomes a flip-chip connection type.

Figure 16:
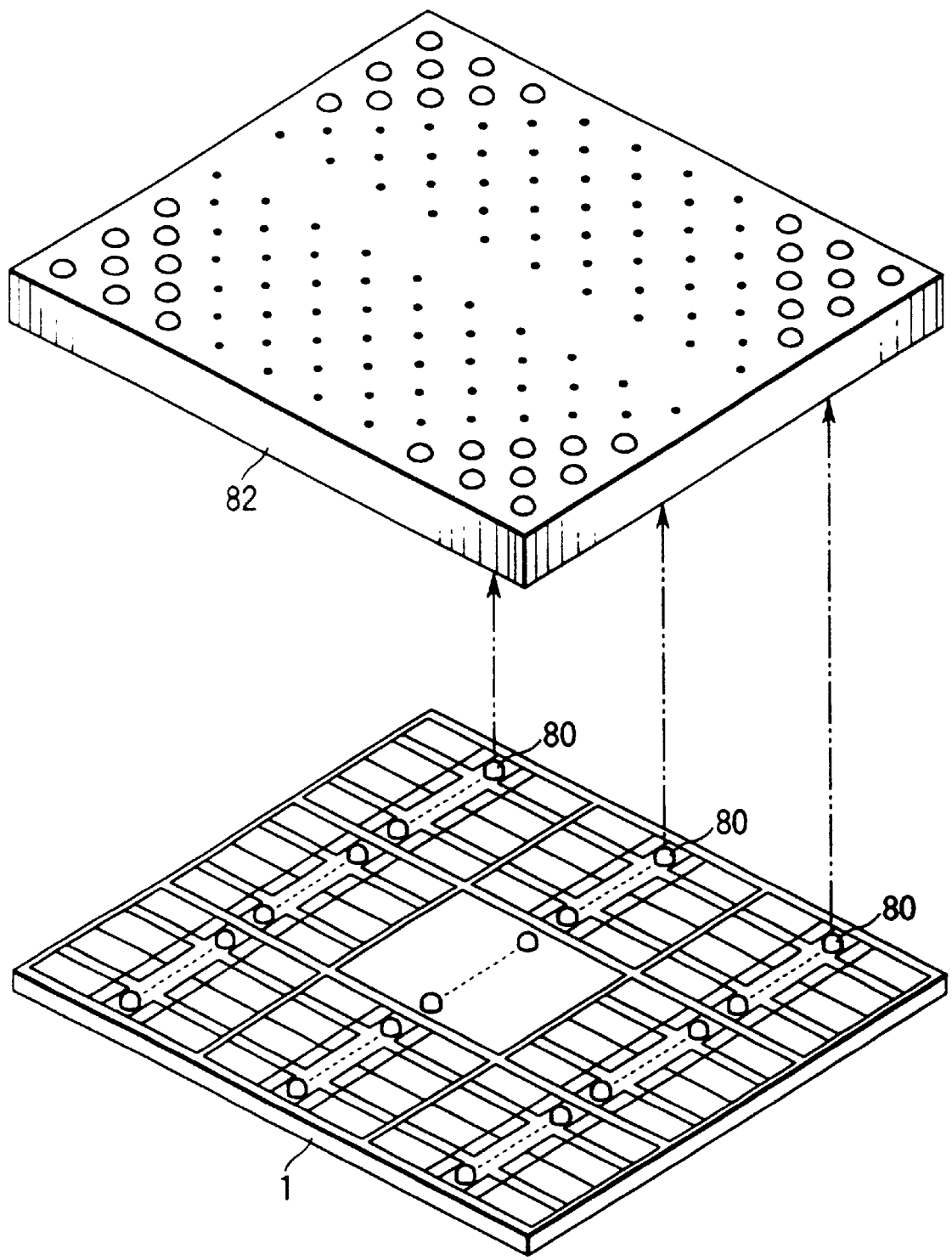
FIG. 16 is a perspective view of a connection substrate for a chip connection that can be used for the embodiment of FIG. 1, which is a synchronous DRAM.

FIG. 16 is a perspective view showing a first example of a connecting substrate for connecting a chip 1 of a synchronous DRAM according to one embodiment of the invention.

As shown in FIG. 16, a connecting substrate 82 according to a first example is a ball grid array type in which the solder balls 80 are disposed as the external terminal in a two-dimensional manner on the surface. The solder balls 80 of the chip 1 are connected to internal connection electrodes (not shown) formed on a rear surface of the connecting substrate 82.

Figure 17:
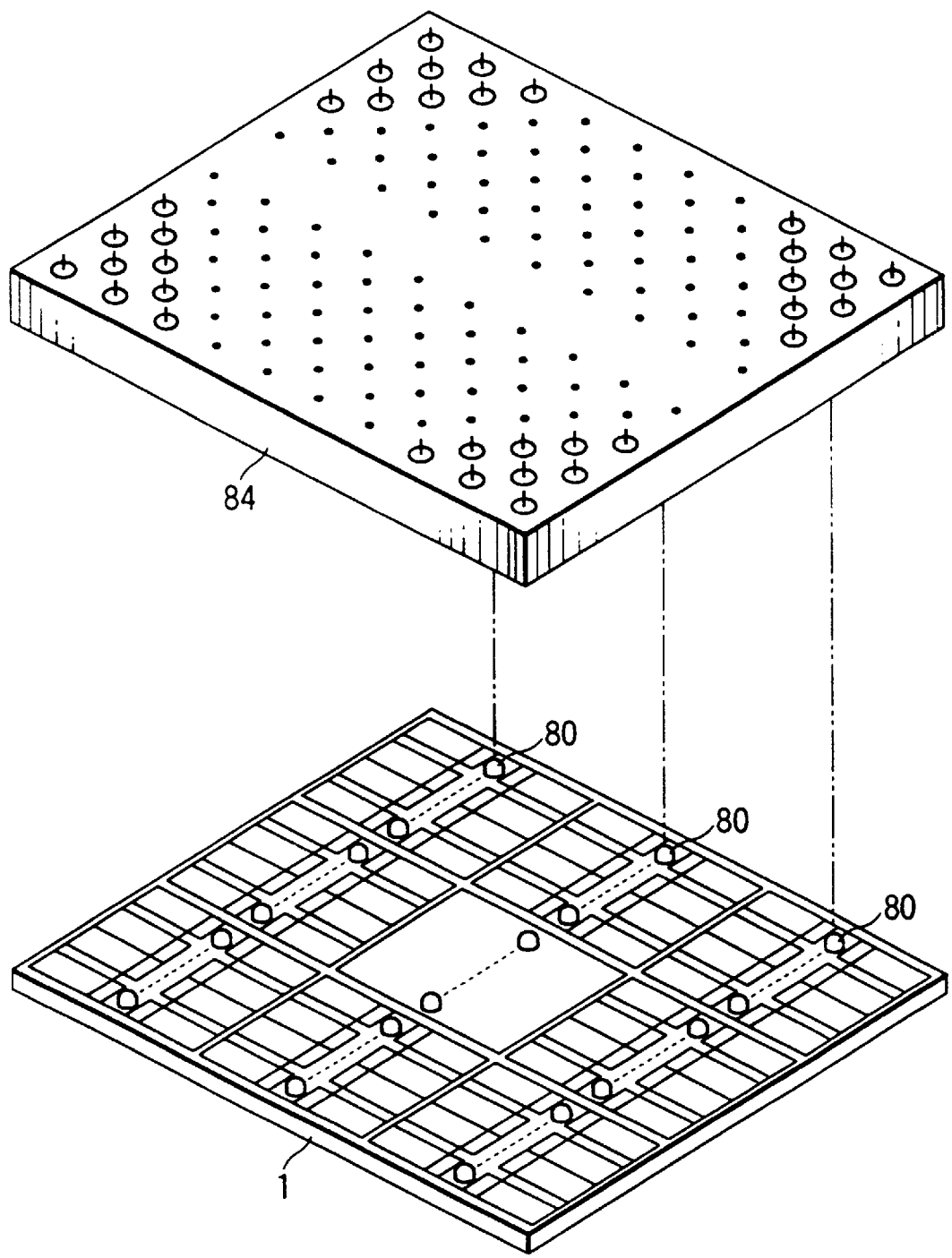
FIG. 17 is a perspective view of another connection substrate for a chip connection that can be used for the embodiment of FIG. 1, which is a synchronous DRAM.

FIG. 17 is a perspective view showing a second example of a connecting substrate for connecting a chip 1 of a synchronous DRAM according to one embodiment of the invention.

As shown in FIG. 17, the connecting substrate 84 according to the second example is a pin grid array type in which pins are disposed at external terminals on a surface in a two-dimensional manner.

The solder balls 80 of the chip 1 are connected, similarly to the ball grid array type connecting substrate 82, to the internal connection electrodes (not shown) formed on a rear surface of the connecting substrate 84. After the solder balls 80 are connected to the connecting substrates 82, 84, the chip 1 is sealed, for example, by resin. Thus, the package of a synchronous DRAM according to one embodiment of the invention is finished and completed.

The above-mentioned synchronous DRAM includes a useful configuration as described below.

First, a control circuit which was unitary in background art devices is divided into a main control circuit and a local control circuit controlled by the main control circuit, and further blocks for forming the DRAM are divided into a main control block including the main control circuit and a plurality of memory blocks, each including a local control circuit and a memory cell array. In such a divided system, first the pads are disposed on each of the divided blocks. Thus, the area for disposing the pads can be enlarged in the entire chip. Therefore, more pads can be disposed on the chip as compared with a background system disposing the pads along the edge of the chip or a system disposing the pads along the center of the chip.

Figure 18:
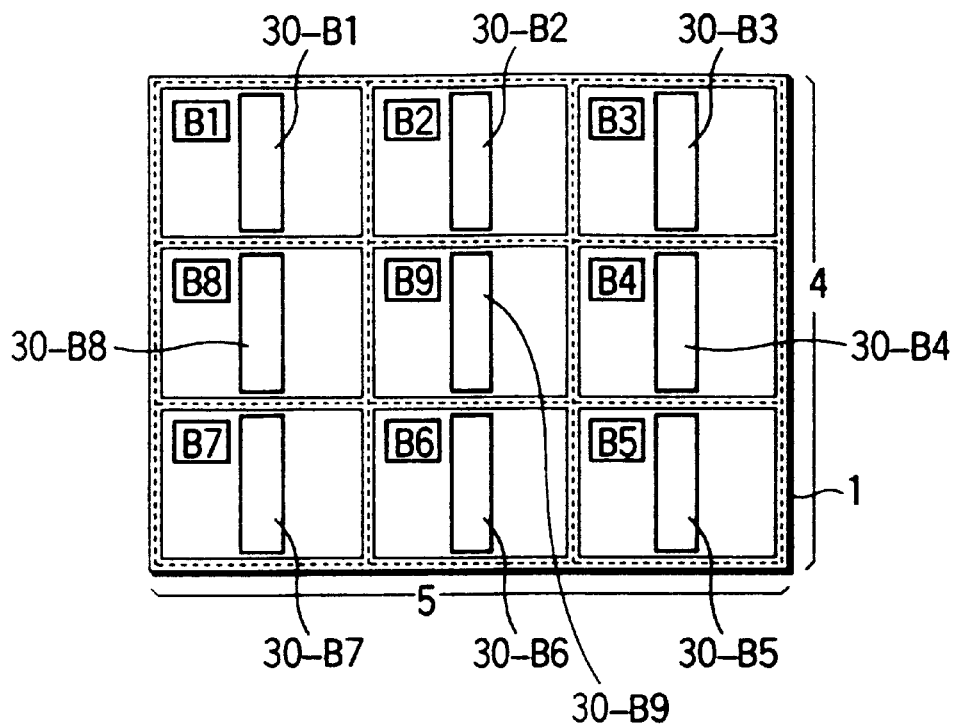
FIG. 18 is plan view of a region for arranging pads that can be used for the embodiment of FIG. 1, which is a synchronous DRAM.
Figure 19:
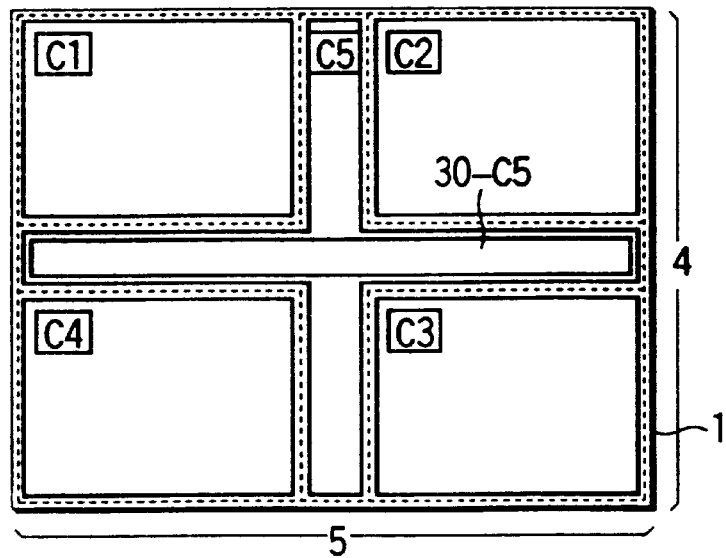
FIG. 19 is a plan view of a region for arranging pads in a comparable background DRAM.

FIG. 18 is a plan view showing a disposing area of pads of a synchronous DRAM according to one embodiment of the invention, and FIG. 19 is a plan view showing the disposing area of the pads of a DRAM according to a comparison example.

As shown in FIG. 19, the DRAM according to the comparison example is divided into four areas C1 to C4 and a cross-shaped area C5 obtained by separating the four areas. Memory cores are disposed in the areas C1 to C4, and a control circuit, an address buffer and an I/O buffer are disposed in the area C5. In the comparison example, the ratio of the short side to the long side is assumed to be 4:5.

As shown in FIG. 18, in a DRAM according to one embodiment of the invention, three rows of pad groups including pad groups 30-B1 to pad groups 30-B9 are provided along the short side direction of the chip 1. Thus, the length of the area in which the pads can be disposed becomes about three times as large as the short side.

In comparison, as shown in FIG. 19, in the DRAM according to the comparison example, one row of pad groups 30-C5 is disposed along the long side direction of the chip 1. Thus, the length of the area in which the pads can be disposed is substantially the same as the long side. Therefore, the DRAM shown in FIG. 18 can increase the area in which the pads can be disposed more than the DRAM shown in FIG. 19.

The external pad group (30-B9) for receiving the external address signal, the external command signal, the external clock signal and the external power source potential is disposed at the main control block of the central area B9, and the external pads for receiving the input data and the output data, i.e., the I/O pad groups (30-B1 to 30-B8), are respectively disposed in the memory blocks of the peripheral areas B1 to B8 of the chip 1. According to this configuration, the I/O pad groups can be particularly dispersed to the entire chip 1, and an increase in the I/O pads in the case of enhancing functions can be easily dealt with.

Second, a data transfer system circuit for electrically coupling the I/O pads to the memory cells is dispersively disposed at each of a plurality of the memory blocks divided as described above. Thus, the data transfer system circuit is closed at each memory block, and the data transfer distance can be relatively shortened as compared with the chip size. Therefore, the data transfer distance of the data transfer system circuit can be further shortened as compared with a system for extending from the memory cell to the I/O pads of the edge of the chip or a system for extending from the memory cell to the I/O pads of the center of the chip. The data transfer distance is further shortened to thereby reduce the data moving quantity as compared with that of a background DRAM. This is particularly effective when it is necessary to operate the data line system circuit at a high speed such as in a burst read/write system.

A data writing operation will now be explained.

Figure 20A:
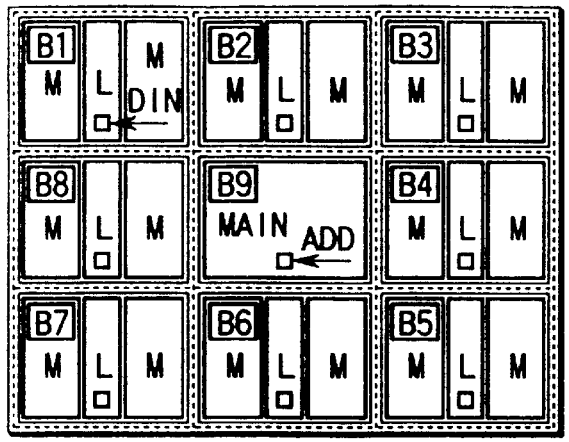
FIGS. 20A to 20C are illustrations showing an operation of writing data into the embodiment of FIG. 1, which is a synchronous DRAM, the operation proceeds in the order of 20A through 20C.
Figure 20B:
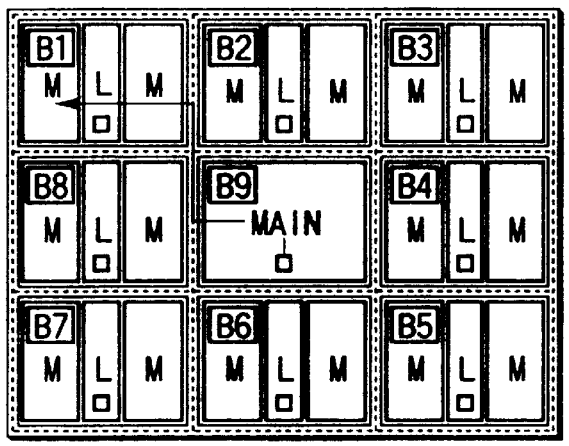
Figure 20C:
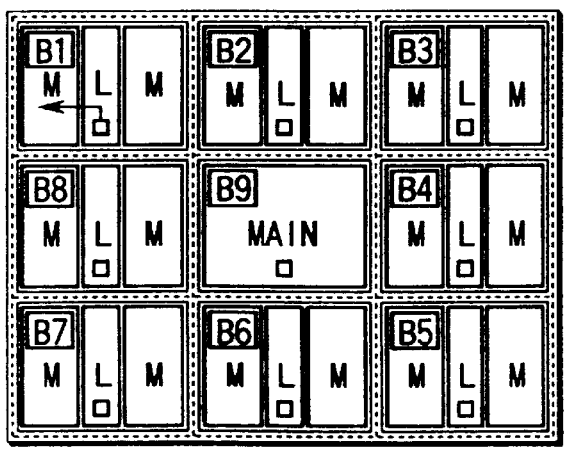
Figure 21A:
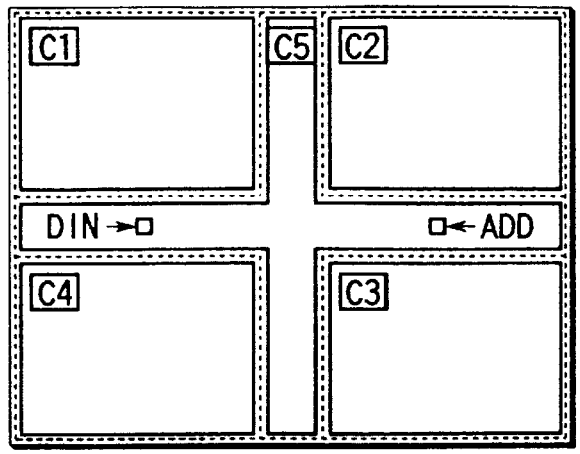
FIGS. 21A to 21C are illustrations showing an operation of writing data into a comparable known DRAM, the operation proceeds in the order of 21A through 21C.
Figure 21B:
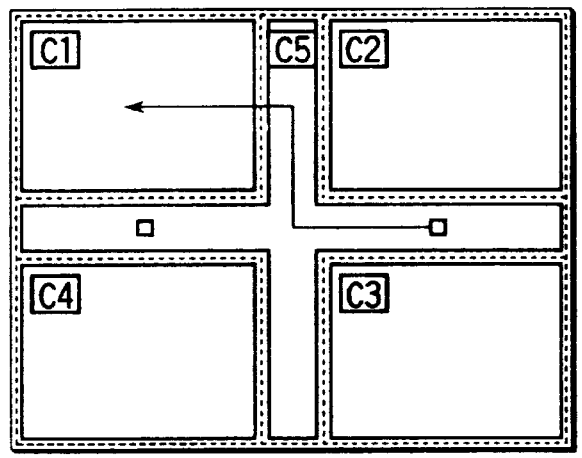
Figure 21C:
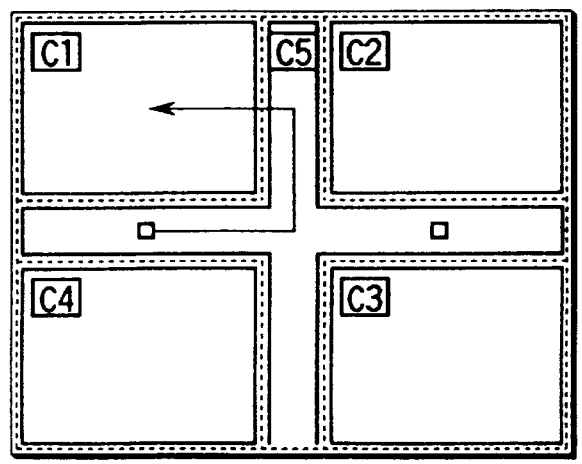

FIG. 20 is a view showing a state of writing data in a synchronous DRAM according to one embodiment of the invention. FIGS. 20A to 20C sequentially show the flow of signals. FIG. 21 is a view showing a state of writing data of the DRAM according to a comparison example. FIGS. 21A to 21C sequentially show the flow of signals.

As shown in FIG. 20A, the input data DIN is supplied to the I/O pad, and the external address ADD is supplied to the address pad. Subsequently, as shown in FIG. 20B, the internal address is input to the memory cell array. Eventually, as shown in FIG. 20C, input data DIN is input to the memory cell selected according to the internal address.

As shown in FIGS. 21A to 21C, even in the DRAM according to the comparison example, the writing sequence is the same. However, as shown in FIGS. 21A to 21C, in the DRAM according to the comparison example, the input data DIN is moved from the area C5 to the area Cl in the Figures. Whereas, as shown in FIGS. 20A to 20C, in the DRAM according to one embodiment of the invention, the input data DIN is moved only in the same area (area B1 in the Figures). Therefore, the DRAM according to one embodiment of the invention decreases a moving amount of the input data DIN as compared with the DRAM according to the comparison example.

A data reading operation will now be explained.

FIG. 22 is a view showing a state of data reading of a synchronous DRAM according to one embodiment of the invention. FIGS. 22A to 22D sequentially show the flow of signals. FIG. 23 is a view showing a state of data reading of the DRAM according to a comparison example. FIGS. 23A to 23D sequentially show the flow of signals.

Figure 22A:
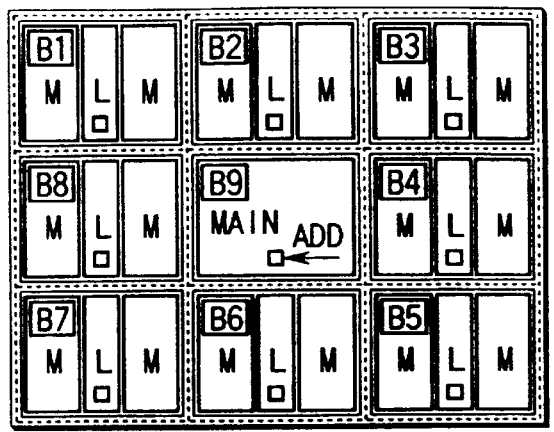
FIGS. 22A to 22D are illustrations showing an operation of reading data from the embodiment of FIG. 1, which is a synchronous DRAM, the operation proceeds in the order of 22A through 22D.
Figure 22B:
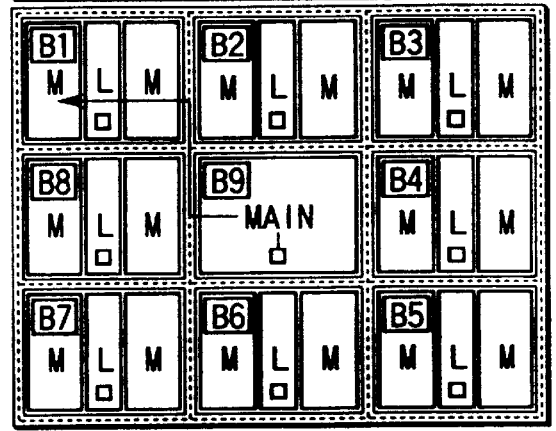
Figure 22C:
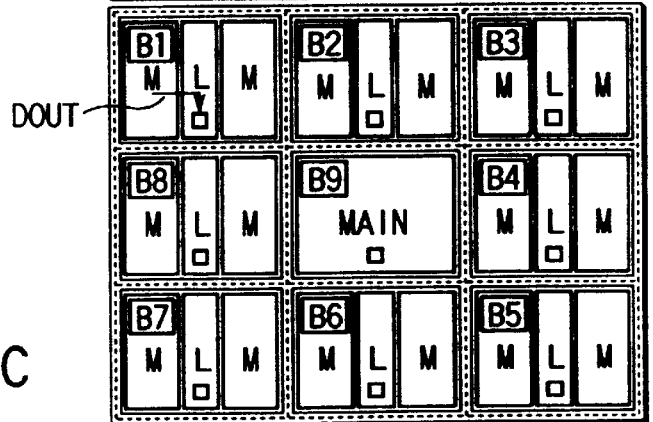
Figure 22D:
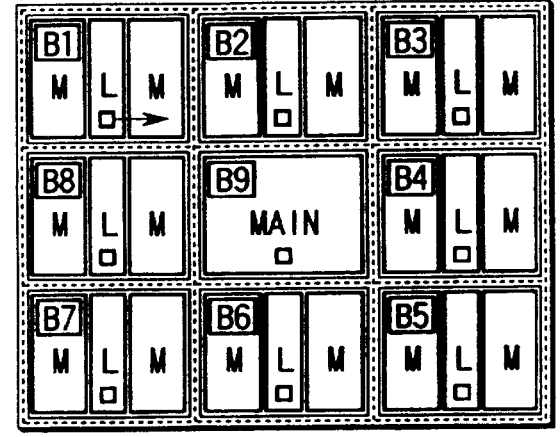
Figure 23A:
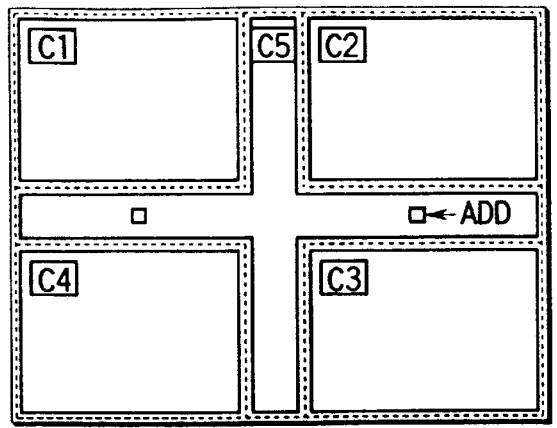
FIGS. 23A to 23D are illustrations showing an operation of reading data from a comparable known DRAM, the operation proceeds in the order of 23A through 23D.
Figure 23B:
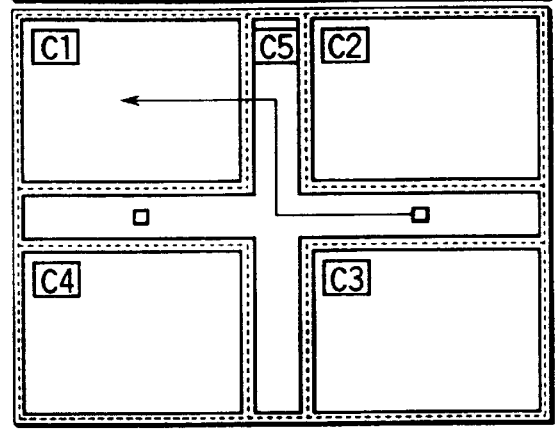
Figure 23C:
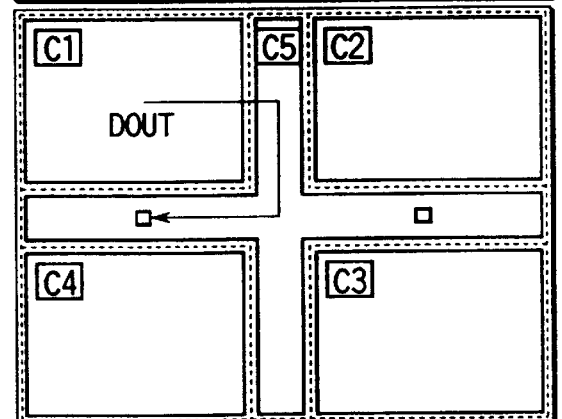
Figure 23D:
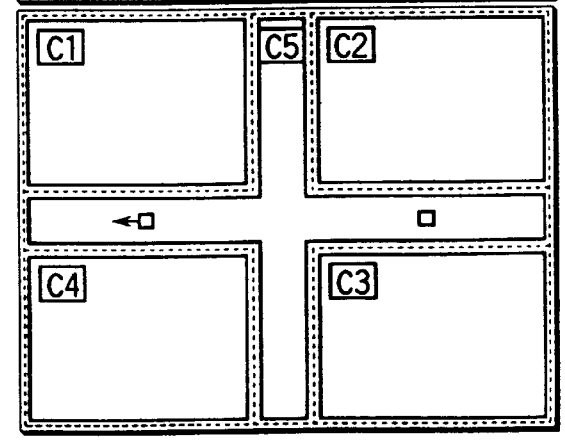

As shown in FIG. 22A, in a DRAM according to one embodiment of the invention, an external address ADD is supplied to the address pad. Then, as shown in FIG. 22B, an internal address is input to the memory cell array. Subsequently, as shown in FIG. 22C, output data DOUT is output from the memory cell selected according to the internal address. Eventually as shown in FIG. 22D, output data DOUT is output from the I/O pad.

As shown in FIGS. 23A to 23D, even in the DRAM according to the comparison example, the reading sequence is the same. However, as shown in FIGS. 23A to 23D, in the DRAM according to the comparison example, the output data DOUT is moved from the area C1 to the area C5 in the Figures. Whereas, as shown in FIGS. 22A to 22D, in the DRAM according to one embodiment of the invention, the output data DOUT is moved only in the same area (the area B1 in the Figures). Therefore, the DRAM according to one embodiment of the invention decreases a moving quantity of the output data DOUT more than the DRAM according to the comparison example.

Third, wirings between the blocks for connecting a plurality of memory blocks 20 to each other may be formed of wiring layers different from the wirings in the block disposed only in the block. Thus, the main control block 10 can be designed independently of the memory block 20. After both are designed, the wirings for connecting the blocks may be separately designed. In the future, both the main control block 10 and the memory block 20 are expected to be more complex in the case of enhancing functions. The concept of designing the control circuit and the memory block in the state including the connection at once as in background art devices increases the developing period. The designing concept of independently designing both and connecting both after the design is completed can shorten the developing period as compared with such a background designing concept.

When the wirings between the blocks are formed by the wiring layer of an upper layer rather than the wirings in the block, the main control block 20 can connect to a plurality of the memory blocks 20, for example, through the memory cell arrays of the memory blocks 20. According to this concept, an effect of increasing the degree of freedoms of disposing the wirings between the blocks is obtained.

Fourth, the chip 1 may be divided into nine areas B1 to B9 of equal shape and equal area of 3×3. The main control block 10 is disposed in one central area B9, and the memory blocks 20 are respectively disposed in the eight peripheral areas B1 to B8. Thus, the memory blocks 20 are respectively disposed in the eight peripheral areas B1 to B8. In this manner, the distances from the one main control block 10 to the eight memory blocks 20 can be most shortened, and yet the distances from the one main control block 10 to the eight memory blocks 20 can be substantially equalized. Thus, an irregularity in the distances is minimized to a minimum limit, and an internal command signal is reduced to a minimum limit as to differences of a time of arriving from the main control block 10 at the memory blocks 20. Therefore, the configuration in which the main control block 10 is disposed in the one central area B1 and the memory blocks 20 are respectively disposed in the eight peripheral areas B1 to B8 can control the memory blocks 20 at the highest speed by the main control block 10.

The above-mentioned four configurations are significant. A DRAM according to one embodiment of the invention may include these significant configurations. However, even one of the four configurations or various combinations of the four configurations may also be, of course, effective.

Furthermore, in the configuration of the nine areas B1 to B9 of the equal shape and equal area of 3×3 of a DRAM according to one embodiment of the invention, the following layout method can be achieved.

First, a circuit pattern of the memory block 20 and a circuit pattern of the main control block 10 are respectively completed. Eights areas having the same size as the completed circuit pattern of a larger size of 3×3 are aligned. The circuit patterns of the memory blocks 20 are disposed one by one in the eight peripheral areas of the nine areas aligned by 3×3, and the circuit pattern of the main control block 10 is disposed at the one central area.

When such a layout method is employed, only one circuit pattern of the memory block 20 may be designed. Since the nine areas of the same size as the circuit pattern of larger size of 3×3 are aligned, the degree of freedoms of layout is increased.

If the circuit pattern of the memory block 20 is, for example, increased, an allowance space is provided in the circuit pattern of the main memory block 10. A size of the boosting capacitor is, for example, enlarged by utilizing the allowance, and hence the higher boosted potential can be generated. Further, a size of a transistor for outputting the internal command signal, i.e., a transistor for driving the longer wirings between the blocks for connecting the main control block 10 to the memory block 20, may be increased by utilizing the allowance, thereby obtaining a higher driving capacity.

A circuit for a test mode such as, for example, a circuit for a built-in self-test can be disposed by utilizing the allowance generated in the main control block 10. Further, if a space is retained in the main control block 10 in advance, other circuits can be additionally disposed in the space in the future. For example, when new functions are added to the apparatus, circuits for performing the new functions are required. Hence, the new circuits may be disposed in the space.

According to such a layout method, when a new function is added to the apparatus, the alteration of the disposing position of the memory block 20, i.e., an alternation of the design which affects the entire apparatus, is not needed and hence the layout method is effective.

On the contrary, if the circuit pattern of the main control block 10 is increased to be larger, an allowance space is provided in the circuit pattern of the memory block 20. The circuit pattern of the memory block 20 is, for example, enlarged as it is by utilizing the allowance, and the size of the memory cell can be, for example, enlarged. Thus, a capacity of a capacitor for holding data is increased, the data holding characteristics are improved and hence yield is expected to be improved.

Further, a DRAM according to one embodiment of the invention may include the following configuration.

Wirings between the blocks for connecting the main control block 10 to a plurality of the memory blocks 20 to each other are formed only of one fourth metal wiring layer. This expedites purification of the pattern of the wirings for connecting the main control block 10 to the plurality of the memory blocks 20. At present, an internal wiring of a memory IC is formed by laminating three metal layers. On the contrary, an internal wiring of a logic IC is formed by laminating four metal layers. The memory block 20 is fundamentally a memory IC, and the main control block 10 is fundamentally a logic IC. In other words, the internal wirings of the memory block 20 can be formed of a fewer number of metal layers than those of the main control block 10. Therefore, the metal layers used for the internal wirings of the main control block 10 and not used for the internal wirings of the memory block 20 can be used and in a DRAM according to one embodiment of the invention, and the fourth metal layer is used for the wirings between the blocks. Since the fourth metal layer is an uppermost metal layer (top layer), if the pad is formed by using the fourth metal layer, a number of the laminated metal layers can be mostly reduced.

When data is read from a DRAM according to one embodiment of the invention, at least one data is preferably read from all of the plurality of memory blocks 20, and is externally output. This becomes an operating method for drawing a capacity to a maximum limit in a method for operating the DRAM having the main control block 10 and the plurality of the memory blocks 20 controlled by the main control block 10 by simultaneously activating all the memory blocks 20.

On the other hand, when data is written in the DRAM, at least one data may be written in all of the plurality of memory blocks 20 in an operating method for drawing the capacity to the maximum limit in the DRAM having the main control block 10 and the plurality of the memory blocks 20 controlled by the main control block 10.

The plurality of the memory blocks 20 may be divided into a plurality of banks in which data can be written and read independently by the internal command signal. Since the memory blocks 20 are divided into the plurality of banks in which the data can be written and read independently from each other, the data precharge period can be apparently eliminated. Therefore, it can be so operated as to continuously output data to an external element. This has the effect of increasing a number of output data per unit time.

The layout of the memory block 20 may be divided into three areas of the LEFT area, the RIGHT area and the CENTER area between the LEFT area and the RIGHT area. The circuit disposing pattern of the LEFT area and the circuit disposing pattern of the RIGHT area are formed in the pattern of a mirror image relation. Thus, the CENTER area can be easily formed in a circuit disposing pattern shared by the LEFT area and the RIGHT area.

A memory cell array, a column decoder and a row decoder are disposed in each of the LEFT area and the RIGHT area. These disposing patterns are formed in the pattern of a mirror image relation. An I/O buffer, an I/O control circuit for controlling the I/O buffer, a data line circuit, a data line circuit control circuit for controlling the data line circuit, a bit line control circuit, etc., are disposed in the CENTER area. This area is shared by the LEFT area and the RIGHT area.

According to such a configuration, the wiring pattern of the circuit of the memory block 20 can be particularly radially extended from the CENTER area toward the LEFT area and the RIGHT area of the mirror image relation, and the radially extended wiring pattern can be terminated in the memory blocks 20.

A method for forming the memory blocks 20 having the above-mentioned layout will now be explained.

FIG. 24 is a view showing a method for forming the memory blocks 20. FIGS. 24A to 24G sequentially show formation of the memory block 20.

Figure 24A:
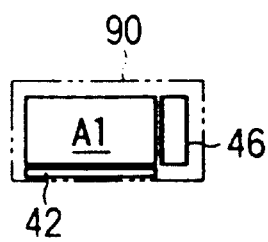
FIGS. 24A to 24G are illustrations showing an operation of forming a memory block 20, the operation proceeds in the order of 24A through 24G.

As shown in FIG. 24A, first, a circuit pattern 90 is formed. The circuit pattern includes a 16 Mbit array A1, a row decoder R/D for selecting the row of the 16 Mbit array A1, and a column decoder C/D for designating the column of the 16 Mbit array A1.

Figure 24E:
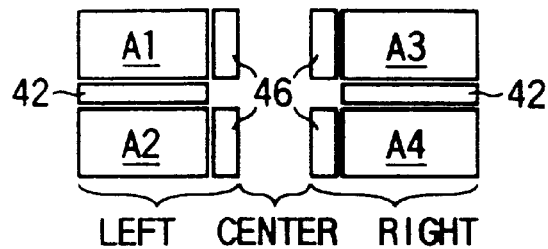
Figure 24B:
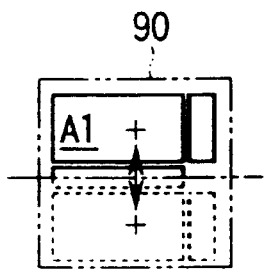

As shown in FIG. 24B, the circuit pattern 90 is folded along the row decoder R/D to form a circuit pattern 91. At this time, the circuit pattern 90 and the circuit pattern 91 become a mirror image relation. Thus, as shown in FIG. 24C, a 16 Mbit array A2, a row decoder R/D for selecting the 16 Mbit array A2 and a column decoder C/D for designating the column of the 16 Mbit array A2 are formed.

Figure 24F:
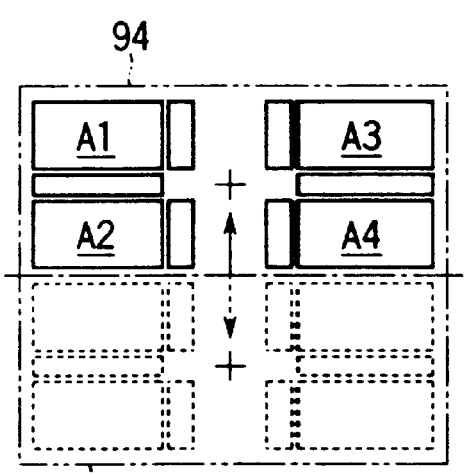
Figure 24C:
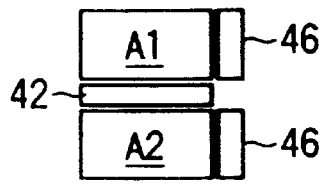
Figure 24D:
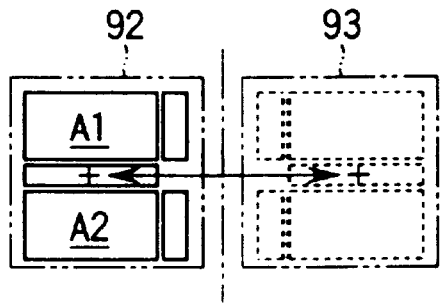

As shown in FIG. 24D, a circuit pattern 92 including the circuit pattern 90 and the circuit pattern 91 is folded along the part which is to become a CENTER area to form a circuit pattern 93. At this time, the circuit pattern 92 and the circuit pattern 93 become a mirror image relation. Thus, as shown in FIG. 24E, a 16 Mbit array A3, a row decoder R/D for selecting the row of the 16 Mbit array A3 and a column decoder C/D for designating the column of the 16 Mbit array A3 are formed. Simultaneously, a 16 Mbit array A4, a row decoder R/D for selecting the row of the 16 Mbit array A4 and a column decoder C/D for designating the column of the 16 Mbit array A4 are formed.

Figure 24G:
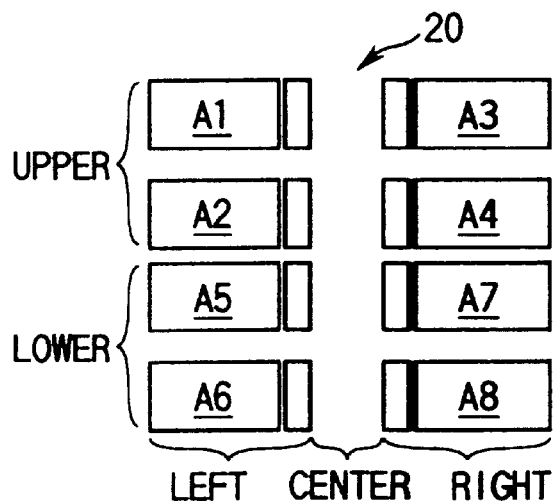

As shown in FIG. 24F, a circuit pattern 94 including the circuit pattern 92 and the circuit pattern 93 are folded along the part to become a boundary between the UPPER area and the LOWER area to form a circuit pattern 95. At this time, the circuit pattern 94 and the circuit pattern 95 become a mirror image relation. Thus, as shown in FIG. 24G, 16 Mbit arrays A5 to A8, row decoder R/D for selecting the rows of the 16 Mbit arrays A5 to A8, and a column decoder C/D for designating the 16 Mbit arrays A5 to A8 are formed. Thus, one of the memory blocks 20 of a DRAM according to one embodiment of the invention can be formed.

A first method for disposing a memory block 20 in the chip 1 will now be explained.

Figure 25:
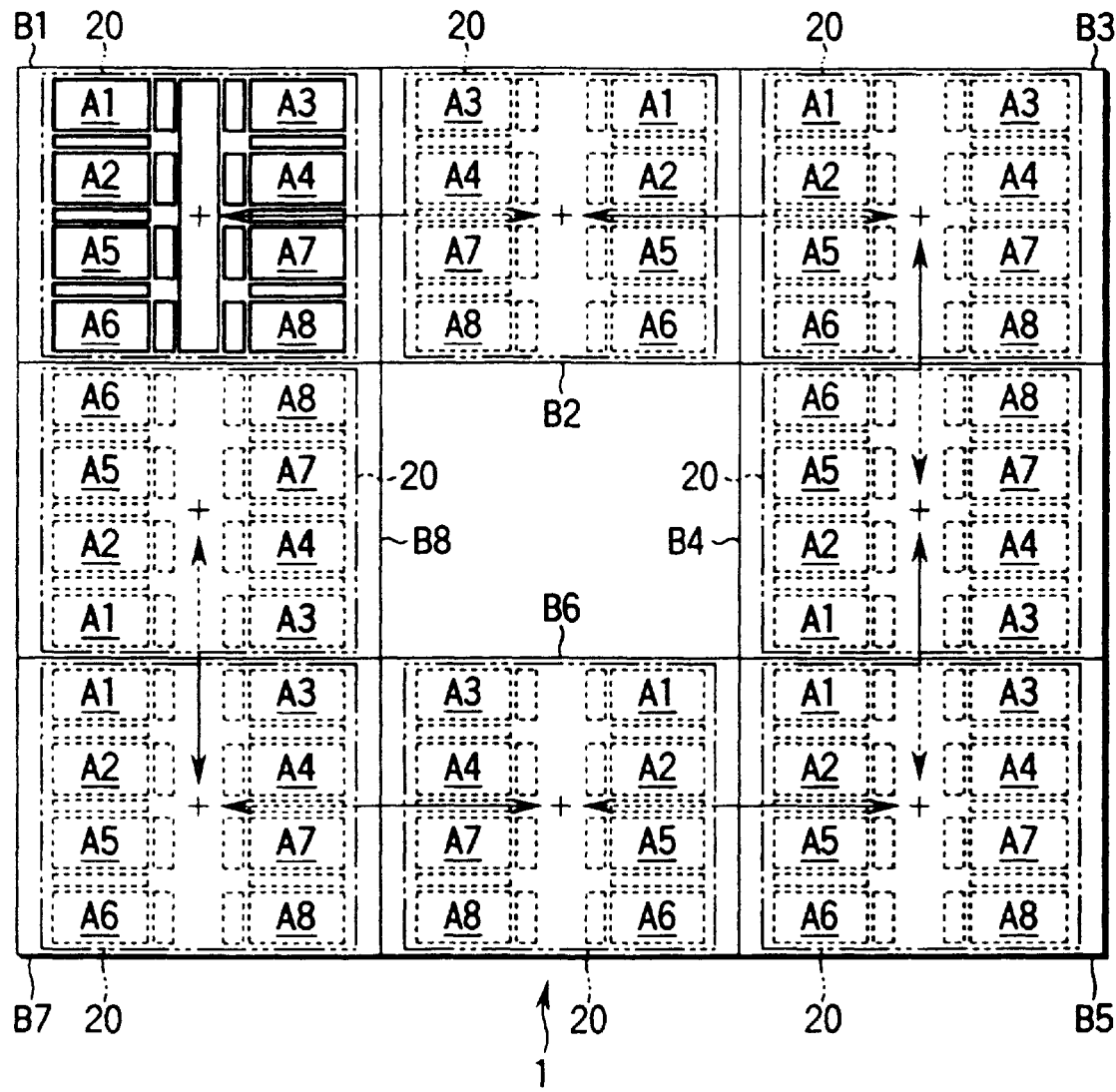
FIG. 25 is an illustration showing a first method of arranging a memory block 20.

FIG. 25 is a view showing a first method for disposing the memory block 20.

As shown in FIG. 25, the memory block 20 shown in FIG. 24G is disposed in the area B1 of the chip 1. Then, the memory block 20 disposed in the area B1 is folded along the portion of a boundary between the area B1 and the area B2. Thus, the memory block 20 is disposed in the area B2. At this time, the memory block 20 disposed in the area B1 and the memory block 20 disposed in the area B2 have a mirror image relation. The memory block 20 disposed in the area B2 is folded along the portion of a boundary between the areas B2 and B3. Thus, the memory block 20 is disposed in the area B3. At this time, the memory block 20 disposed in the area B2 and the memory block 20 disposed in the area B3 have a mirror image relation.

Similar dispositions are sequentially conducted up to the area B8 to thereby dispose the memory blocks 20 in each of the area 1 to the area 8 of the chip 1.

A second method for disposing a memory block 20 in the chip 1 will now be explained.

Figure 26:
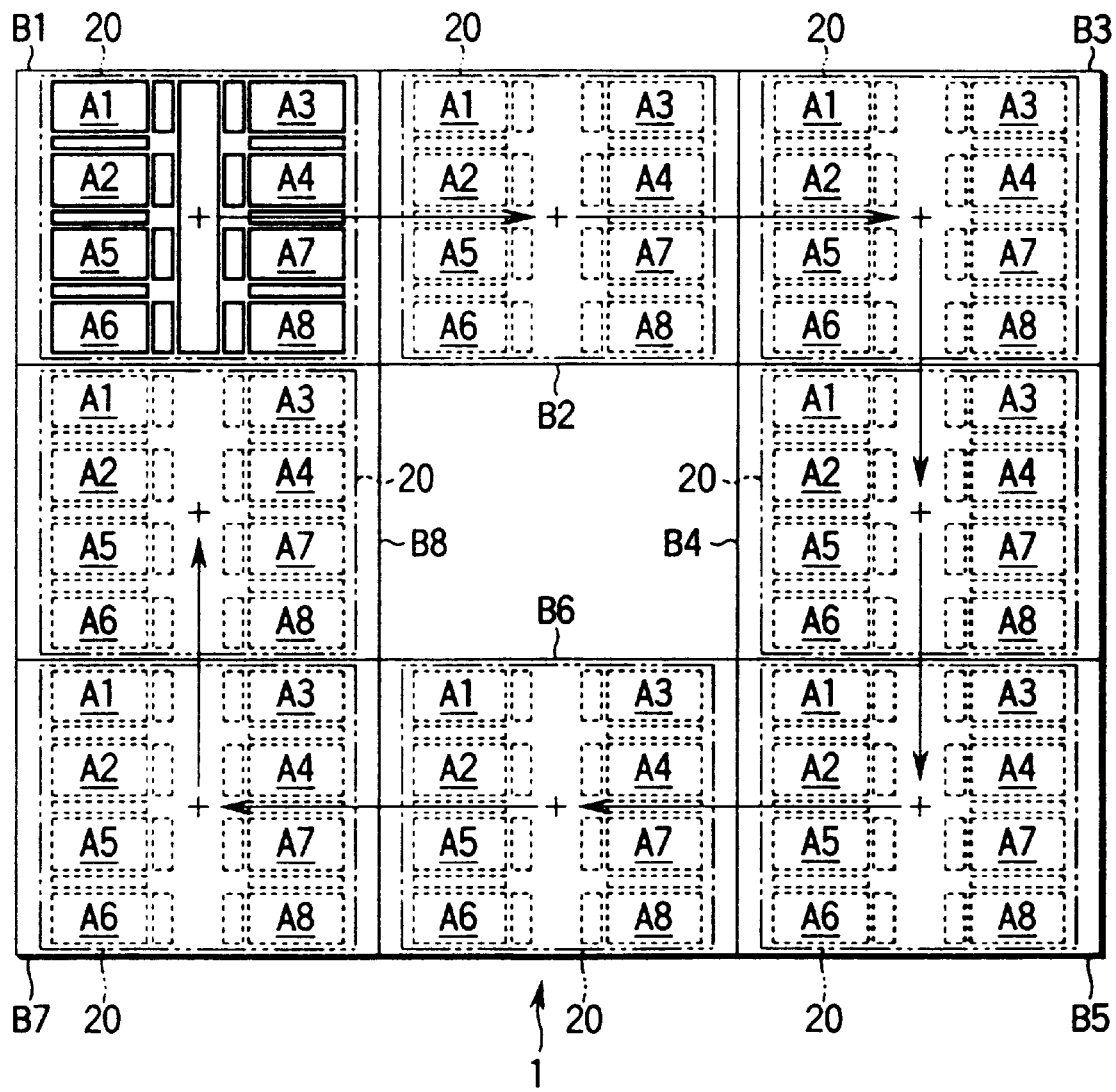
FIG. 26 is an illustration showing a second method of arranging a memory block 20.

FIG. 26 is a view showing a second method for disposing the memory block 20.

As shown in FIG. 26, the memory block 20 shown in FIG. 24G is disposed in the area B1 of the chip 1. Then, the memory block 20 disposed in the area B1 is copied in the area B2. Thus, the memory block 20 is disposed in the area B2. At this time, the memory block 20 disposed in the area B1 and the memory block 20 disposed in the area B2 are entirely the same pattern. The memory block 20 disposed in the area B2 is copied in the area B3. At this time, the memory block 20 disposed in the area B2 and the memory block 20 disposed in the area B3 are entirely the same pattern.

Similar dispositions are sequentially conducted up to the area B8 to thereby dispose the memory blocks 20 in each of the area 1 to the area 8 of the chip 1.

When the memory blocks 20 are disposed in the areas B1 to B8 according to the first and second methods for disposing the memory blocks 20, even if the areas B1 to B8 are set to the chip 1 by odd×odd, such as 3×3, an effect of generating no wasteful area between the memory blocks 20 is provided.

Figure 27:
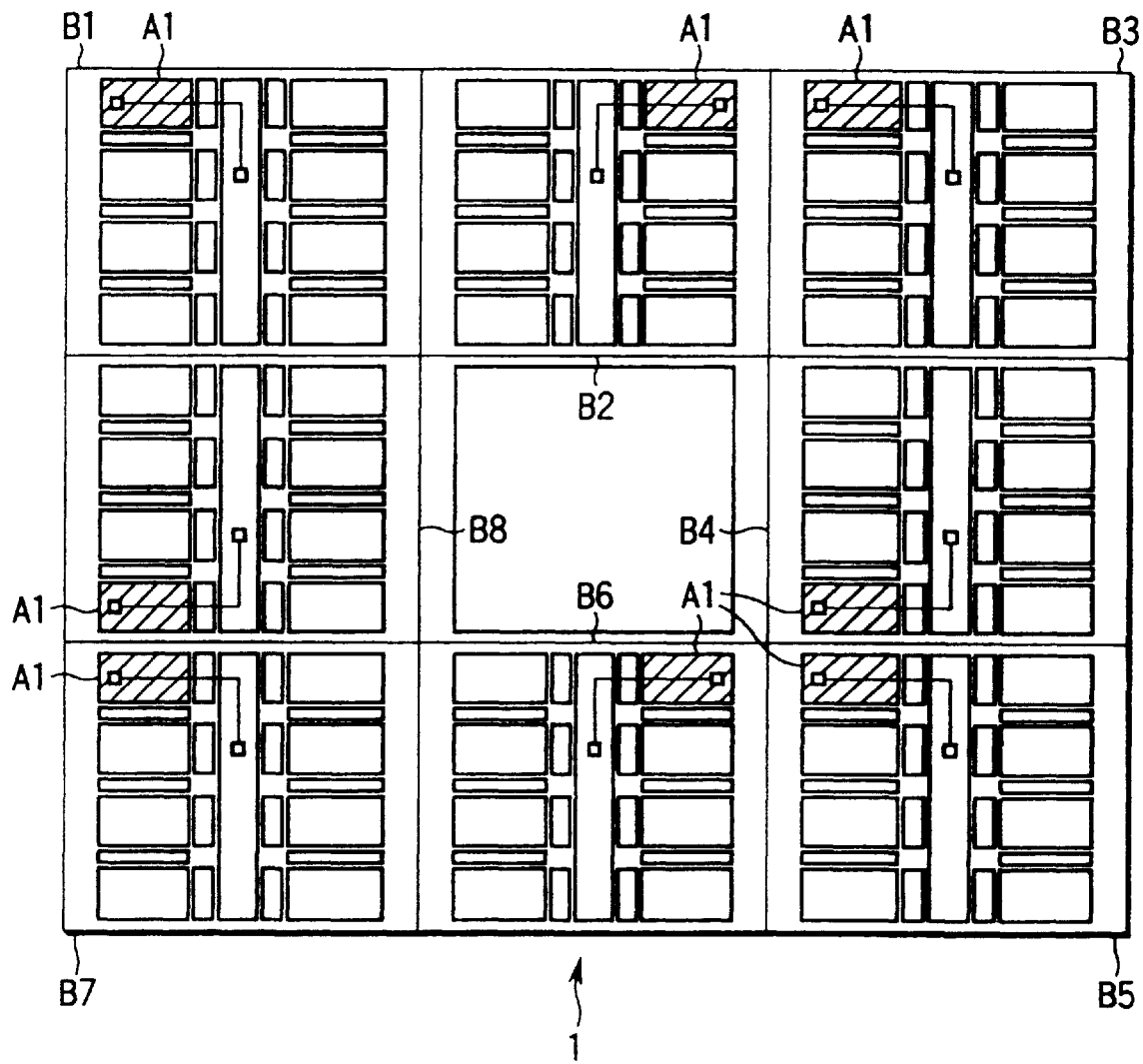
FIG. 27 is an illustration showing an operation of data reading/data writing when the memory block 20 is arranged by the first arranging method.
Figure 28:
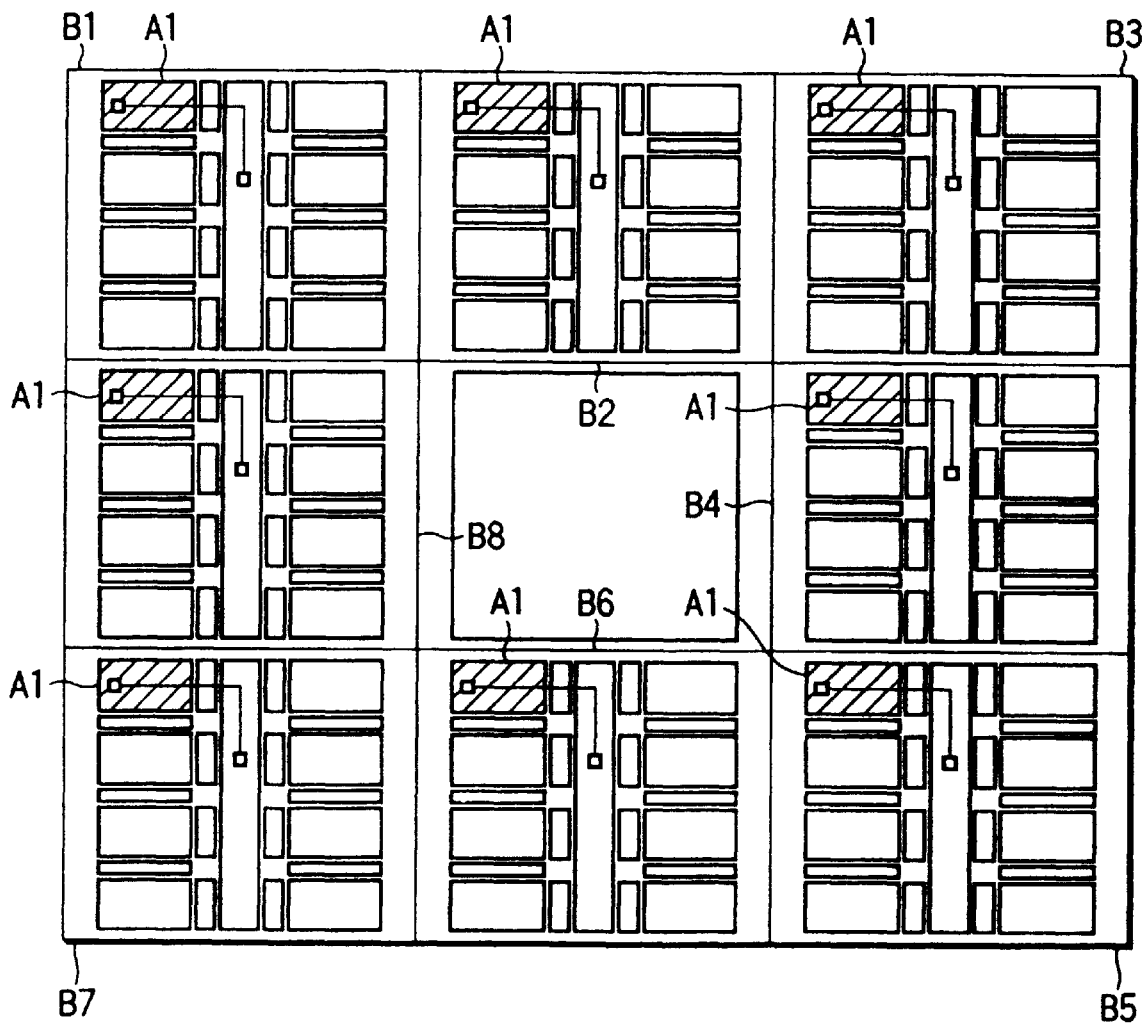
FIG. 28 is an illustration showing an operation of data reading/data writing when the memory block 20 is arranged by the second arranging method.
Figure 29A:
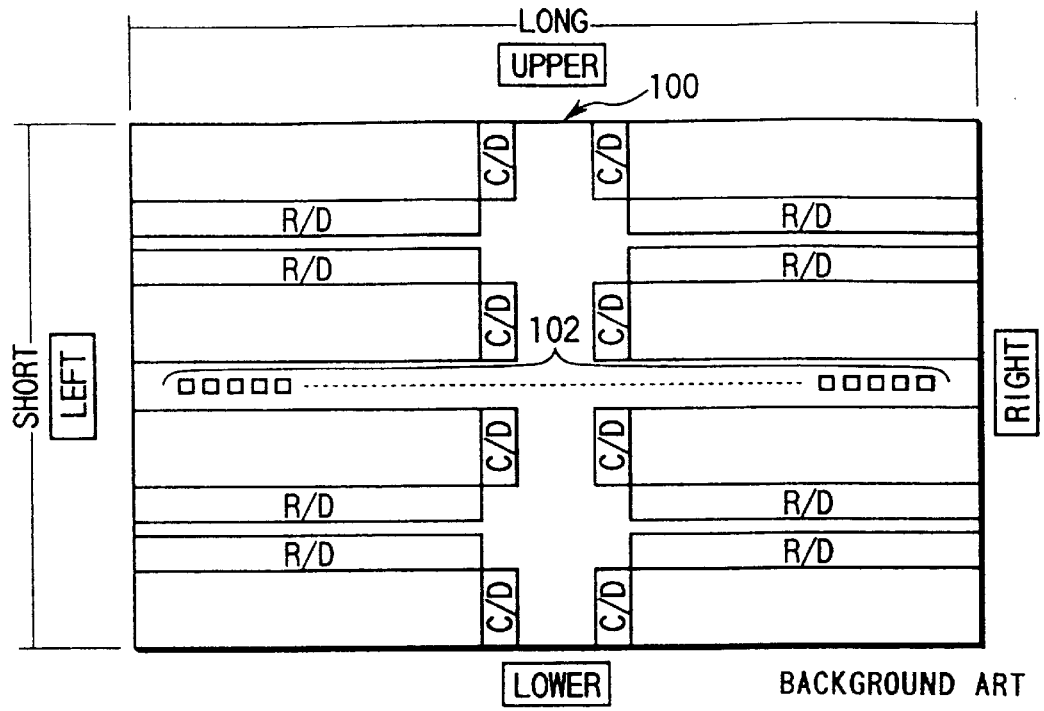
FIGS. 29A and 29B show a background DRAM, where 29A is a plan view and 29B is a plan view showing an inside of a package.
Figure 29B:
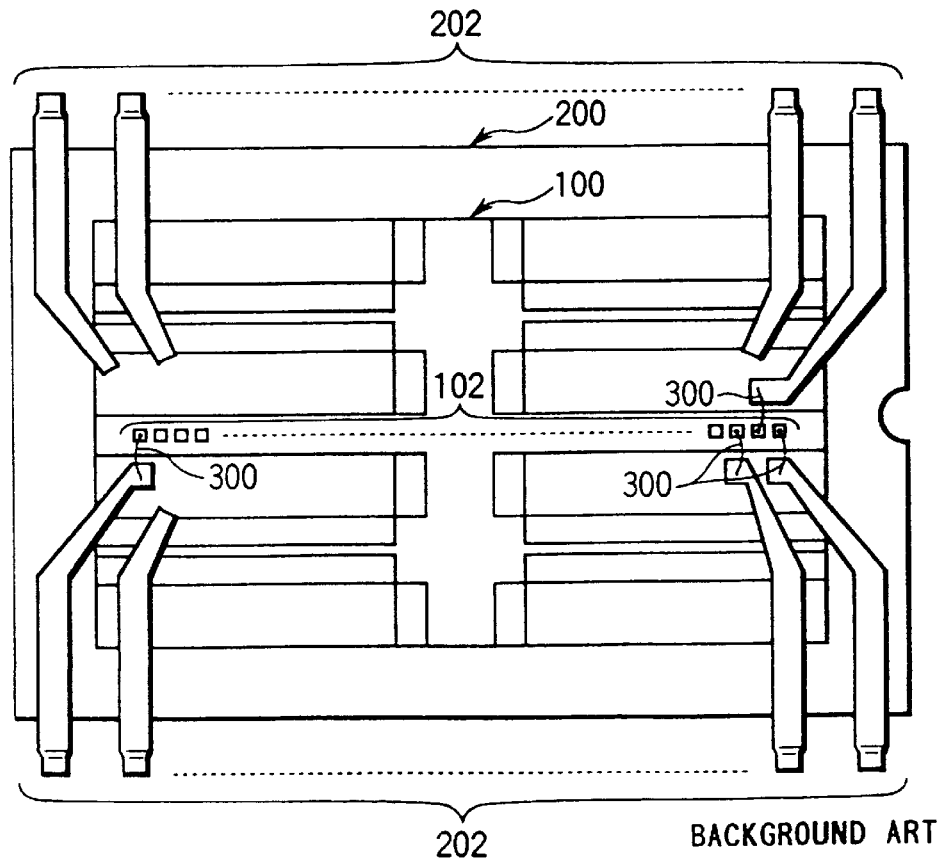
Figure 30:
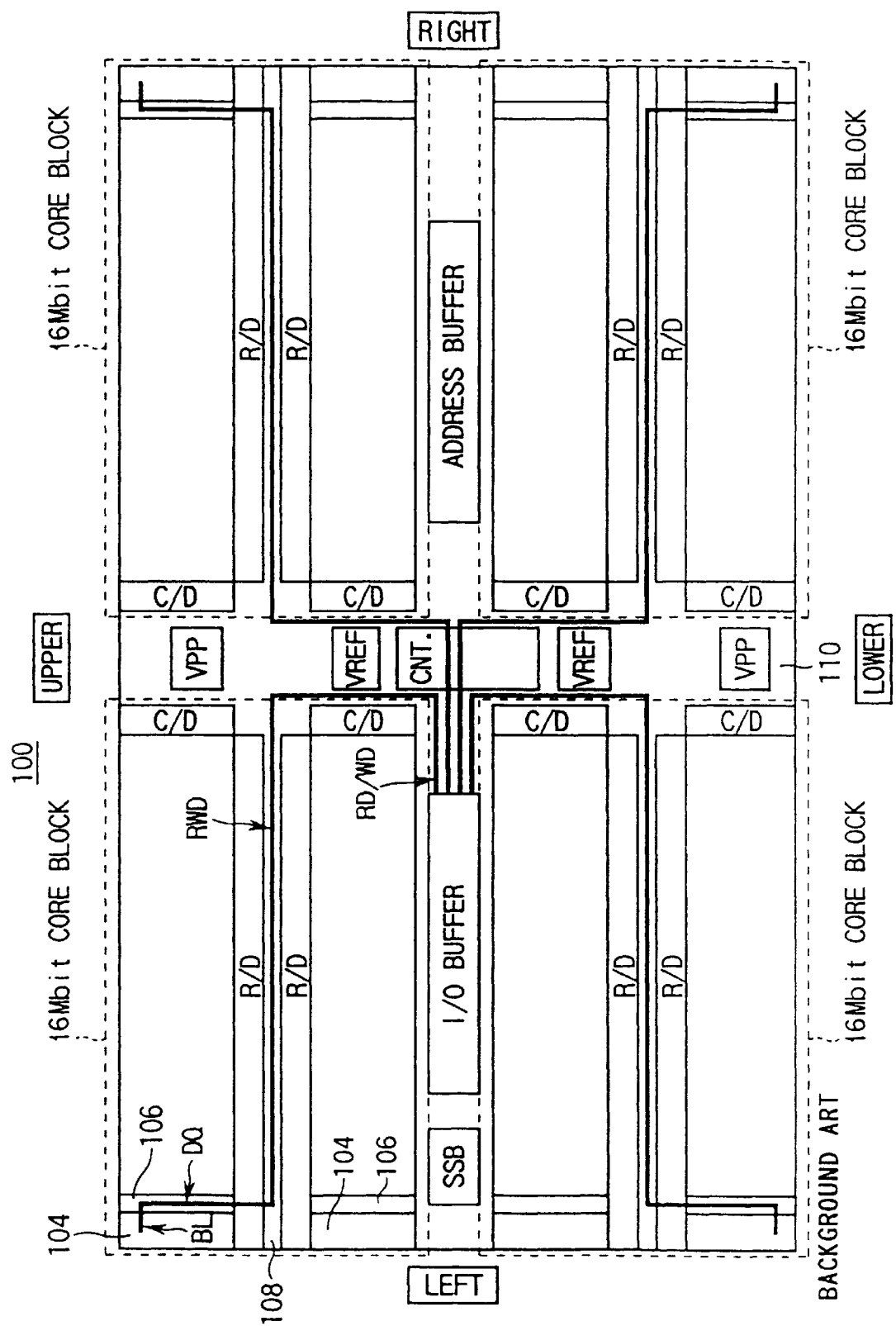
FIG. 30 is a plan view showing an arrangement of data lines of a background DRAM.

FIG. 27 is a view showing a reading operation/writing operation of data when a memory block 20 is disposed according to the first method for disposing the memory block 20. FIG. 28 is a view showing a reading operation/writing operation of data when the memory block 20 is disposed according to the second method for disposing the memory block 20. FIGS. 27 and 28 show when a DRAM has a "x8-bit configuration".

As shown in FIGS. 27 and 28, an address signal designates 16 Mbit array A1 of eight 16 Mbit arrays A1 to A8. The memory cell of the address designated by the address signal included in the designated 16 Mbit array A1 is connected to an I/O pad in all the areas B1 to B8.

When the memory block 20 is disposed according to the first method for disposing the memory block, the distribution of the data lines to be activated simultaneously is not uniform (FIG. 27). On the contrary, when the memory block 20 is disposed according to the second method for disposing the memory block, the distribution of the data lines to be activated simultaneously becomes uniform (FIG. 28). The DRAM can be operated by both the first method for disposing the memory block and the second method for disposing the memory block. However, the second method for disposing the memory block in which the distribution of the data lines to be activated simultaneously becomes uniform is preferable. If the distribution of the data lines to be simultaneously activated is not uniform, it is considered that an unpredictable adverse influence may occur in the chip 1 in the case of miniaturization. On the contrary, if the distribution of the data lines to be simultaneously activated is uniform, the probability of the adverse influence is considered to be low.

According to the present invention as described above, even if the number of the pads is remarkably increased, the pads can be sufficiently disposed, and a semiconductor memory device, a method for layout of the semiconductor memory device, a method for operating the semiconductor memory device and a circuit disposing pattern for the semiconductor memory device in which the increase in size of the control signal line and the data line can be suppressed, the ability of the present semiconductor memory device such as the accessing time or the number of output data per unit time can be maintained, and which are further adapted for enhancing the functions and large-scale of the memory capacity to be able to be remarkably improved can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
 a main control block having an address signal terminal, a clock signal terminal, a command signal terminal and a power supply terminal as external terminals and including an address signal generating section for receiving an external address signal fed to the address signal terminal to generate an internal address signals, a command signal generating section for receiving an external command signal fed to the command signal terminal to generate an internal command signal, a clock signal generating section for receiving an external clock signal fed to the clock signal terminal to generate an internal clock signal and an internal power supply generating section for receiving an external supply potential fed to the power supply terminal to generate an internal supply potential; and at least one memory block, each memory block having a data input/output terminal and a power supply terminal for data input/output, a plurality of memory cells for storing data, a data input/output section for sending data to and receiving data from the data input/output terminal in response to the internal command signal and in synchronism with the internal clock signal, the data input/output section being driven by the source power for data input/output fed to the power supply terminal for data input/output, and a memory control section for writing data in a specific one of the plurality of memory cells and reading data from a specific one of the plurality of memory cells in response to the internal address signal and in synchronism with the internal clock signal, the memory control section being driven by the internal power supply potential.

2. A semiconductor memory device according to claim 1, wherein:

said address signal generating section includes a row address buffer and column address buffer for producing internal addresses, said command signal generating section includes a bank switching control circuit for independently writing data in and reading data from each bank, a word line control circuit for controlling word lines, a sense amplifier control circuit for controlling sense amplifiers and a read/write discriminating circuit for discriminating between a read out mode and a write in mode, said clock signal generating section includes an internal clock generating circuit for generating an internal clock, said internal power supply generating section includes a DC power supply generating circuit for generating a plurality of internal power supply potentials, and said at least one memory block includes a row decoder and a column decoder for selecting a specific memory cell according to the internal address signal, a sense amplifier for amplifying the data of the memory cell, a bit line control circuit for controlling the sense amplifier and bit line precharge, a data line circuit for transferring data between the sense amplifier and the data input/output section, a data line circuit control circuit for controlling the data line, an output buffer and an input buffer contained in the data input/output section and a data input/output control circuit for controlling the data output buffer and the data input buffer.

3. A semiconductor memory device according to either one of claims 1 or 2, wherein the internal clock signal, the internal address signal, the internal command signal and the internal power supply potential are fed from the main control block to the at least one memory block by using a wire in an upper layer located above a wire used for the at least one memory block.

4. A semiconductor memory device according to claim 3, wherein:

said wire used for the at least one memory block is formed by using a first, second or third metal layer, and the wire layer for connecting the main control block and the at least one memory block is formed by using a fourth metal layer.

5. A semiconductor memory device according to claim 2, wherein the at least one memory block is divided into a plurality of banks where data can be written into and read out from independently.

6. A semiconductor memory device comprising:

a main control block for receiving an external address signal, an external command signal, an external clock signal and an external power supply potential and sending out an internal address signal, an internal command signal, an internal clock signal and an internal power supply potential;

a plurality of memory blocks controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to the external element an output data from a memory cell selected for data reading in synchronism with the internal clock signal;

a first external pad group arranged in the main control block for receiving the external address signal, the external command signal, the external clock signal and the external power supply potential;

a second external pad group arranged in each or the plurality of memory blocks for receiving the input data and the output data.

7. A semiconductor memory device comprising:

a main control block for receiving an external address signal, an external command signal, an external clock signal and an external power supply potential and sending out an internal address signal, an internal command signal, an internal clock signal and an internal power supply potential;

a plurality of memory blocks controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to the external element an output data from a memory cell selected for data reading in synchronism with the internal clock signal; and a wire group formed by using an upper wire layer formed in each of the plurality of memory blocks and connecting the main control block and each of the plurality of memory blocks to feed signals for controlling the plurality of memory blocks.

8. A semiconductor memory device comprising:

a main control block for receiving an external address signal, an external command signal, an external clock signal and an external power supply potential and sending out an internal address signal, an internal command signal, an internal clock signal and an internal power supply potential;

a plurality of memory blocks controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to the external element an output data from a memory cell selected for data reading in synchronism with the internal clock signal;

supply wires connecting the main control block and each of the plurality of memory blocks for feeding each of the plurality of memory blocks with the internal address signal, the internal command signal, the internal clock signal and the internal power supply potential generated by the main control block; and data transfer circuits arranged respectively in the plurality of memory blocks, each connecting a respective external pad for receiving the input data and the output data and the memory cell.

9. A semiconductor memory device comprising:

a main control block for receiving an external address signal, an external command signal, an external clock signal and an external power supply potential and sending out an internal address signal, an internal command signal, an internal clock signal and an internal power supply potential; and a plurality of memory blocks controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to the external element an output data from a memory cell selected for data reading in synchronism with the internal clock signal;

wherein at least a data is read out from each of the plurality of memory blocks and all the read out data are sent out to the external element simultaneously.

10. A circuit arrangement pattern comprising:

a main control block for receiving an external address signal, an external command signal, an external clock signal and an external power supply potential and sending out an internal address signal, an internal command signal, an internal clock signal and an internal power supply potential; and a plurality of memory blocks controlled by the main control block, each of the plurality of memory blocks receiving the internal address signal, the internal command signal, the internal clock signal and the internal power supply potential, writing an input data supplied from an external element in a memory cell selected for data writing in synchronism with the internal clock signal and sending out to the external element an output data from a memory cell selected for data reading in synchronism with the internal clock signal;

wherein each of the plurality of memory blocks is divided into three regions of a first circuit region, a second circuit region and a third circuit region arranged between the first and second circuit regions, the circuit arrangement pattern of the second circuit region being a mirror image of the circuit arrangement pattern of the first circuit region, the circuit arranged in the third circuit region being a circuit shared by the circuit arranged in the first region and the circuit arranged in the second region.

* * * * *